US007416837B2

(12) United States Patent
Nozaki et al.

(10) Patent No.: US 7,416,837 B2
(45) Date of Patent: Aug. 26, 2008

(54) RESIST PATTERN-IMPROVING MATERIAL AND A METHOD FOR PREPARING A RESIST PATTERN BY USING THE SAME

(75) Inventors: Koji Nozaki, Atsugi (JP); Miwa Kozawa, Hiratsuka (JP)

(73) Assignee: Fujitsu Limited, Kawasaki (JP)

( * ) Notice: Subject to any disclaimer, the term of this patent is extended or adjusted under 35 U.S.C. 154(b) by 228 days.

(21) Appl. No.: 10/290,493

(22) Filed: Nov. 8, 2002

(65) Prior Publication Data

US 2003/0170571 A1  Sep. 11, 2003

(30) Foreign Application Priority Data

Mar. 5, 2002  (JP) ............... 2002-059429

(51) Int. Cl.
*G03C 5/00* (2006.01)
(52) U.S. Cl. .................. 430/314; 430/324; 430/313; 430/311; 430/331
(58) Field of Classification Search ............... 430/311, 430/313, 156, 270.1, 286.1, 330, 322
See application file for complete search history.

(56) References Cited

U.S. PATENT DOCUMENTS

| | | | |
|---|---|---|---|
| 3,067,077 | A | 12/1962 | Latella et al. |
| 4,983,492 | A * | 1/1991 | Trefonas et al. ............. 430/191 |
| 5,622,909 | A | 4/1997 | Furuya et al. ............... 503/216 |
| 5,858,620 | A | 1/1999 | Ishibashi et al. ............ 430/313 |
| 6,020,093 | A * | 2/2000 | Shibuya et al. ................ 430/7 |
| 6,319,853 | B1 | 11/2001 | Ishibashi et al. ............ 438/780 |
| 6,335,143 | B1 * | 1/2002 | Sumino et al. ........... 430/280.1 |
| 6,537,719 | B1 * | 3/2003 | Takahashi ................... 430/191 |
| 6,579,657 | B1 * | 6/2003 | Ishibashi et al. ......... 430/270.1 |
| 2002/0037476 | A1 | 3/2002 | Kamijima ................... 430/311 |
| 2003/0102285 | A1 * | 6/2003 | Nozaki et al. ................. 216/41 |
| 2003/0143490 | A1 * | 7/2003 | Kozawa et al. ............. 430/315 |

FOREIGN PATENT DOCUMENTS

| | | |
|---|---|---|
| DE | 198 14 142 | 10/1998 |
| DE | 198 43 179 | 7/1999 |
| DE | 100 14 083 | 3/2001 |
| EP | 1 152 036 | 11/2001 |
| EP | 001152036 A1 * | 11/2001 |
| EP | 1 315 043 | 5/2003 |
| GB | 676 372 | 7/1952 |
| JP | 4-224877 | 8/1992 |
| JP | 6-250379 | 9/1994 |
| JP | 10-73927 | 3/1998 |
| JP | 2001-162929 | 6/2001 |
| JP | 2001-228616 | 8/2001 |
| JP | 2001-332484 | 11/2001 |
| JP | 2002-23366 | 1/2002 |
| JP | 2002-23389 | 1/2002 |
| JP | 2002-60793 | 2/2002 |
| WO | WO 03/014830 | 2/2003 |

OTHER PUBLICATIONS

Chemically amplified ArF excimer laser resists using the absorption band shift method Makoto Nakase, Takuya Naito, Koji Asakawa, Akinori Hongu, Naomi Shida, and Tohru Ushirogouchi Proc. SPIE 2438, 445 (1995) hereinafter referred to as Nakase et al.*
Takeo Ishibashi, et al.; *Advanced Micro-Lithography Process for i-line Lithography*; Jpn. J. Appl. Phys., 2001, vol. 40, pp. 7156-7161.
Takashi Kanda, et al.; *Advanced Microlithography Process with Chemical Shrink Technology*; Advances in Resist and Processing XVII, 2000, Proceedings of SPIE vol. 3999, pp. 881-889.
Takeo Ishibashi, et al.; Advanced Micro-Lithography Process with Chemical Shrink Technology; Japanese Journal of Applied Physics, vol. 40, Part 1, No. 1, Jan. 2001, pp. 419-425.
Mamoru Terai, et al.; Below 70-nm Contact Hole Pattern with RELACS Process on ArF Resist; Advanced Technology R&D Center, Mitsubishi Electric, Japan.
Mamoru Teria, et al.; Newly Developed Resolution Enhancement Lithography Assisted by Chemical Shrink Process and Materials for Next-Generation Devices; Japanese Journal of Applied Physics, vol. 45, No. 6B, 2006, pp. 5354-5358.

* cited by examiner

*Primary Examiner*—John A. McPherson
*Assistant Examiner*—Daborah Chacko Davis
(74) *Attorney, Agent, or Firm*—Westerman, Hattori, Daniels & Adrian, LLP.

(57) ABSTRACT

The present invention provided an improvement to reduce an edge roughness during forming a small and fine pattern. Such and objective is to accomplish that after patterning a resist film, a coating film is formed on the resist film, so as to intermix the resist film material with the coating film material at the interface therebetween to reduce the edge roughness. There is provided a resist pattern-improving material, comprising: (a) a water-soluble or alkali-soluble composition, comprising: (i) a resin, and (ii) a crosslinking agent. Alternatively, The resist pattern-improving material, comprising (a) a water-soluble or alkali-soluble composition, comprising: (i) a resin, and (ii) a nonionic surfactant. According to the present invention, a pattern is prepared in the step, comprising: (a) forming a resist pattern; and (b) coating the resist pattern-improving material on the surface of the resist pattern. According to the present invention, the resist pattern-improving material is mixed with the resist pattern at the interface therebetween. The resist pattern may be formed by irradiating a ArF excimer laser light or a laser light having a wavelength shorter than that of the ArF excimer laser light. The pattern of the resist pattern-improving material includes a base resin which does not substantially transmit the ArF excimer laser light.

18 Claims, 30 Drawing Sheets

FIG.1(a)
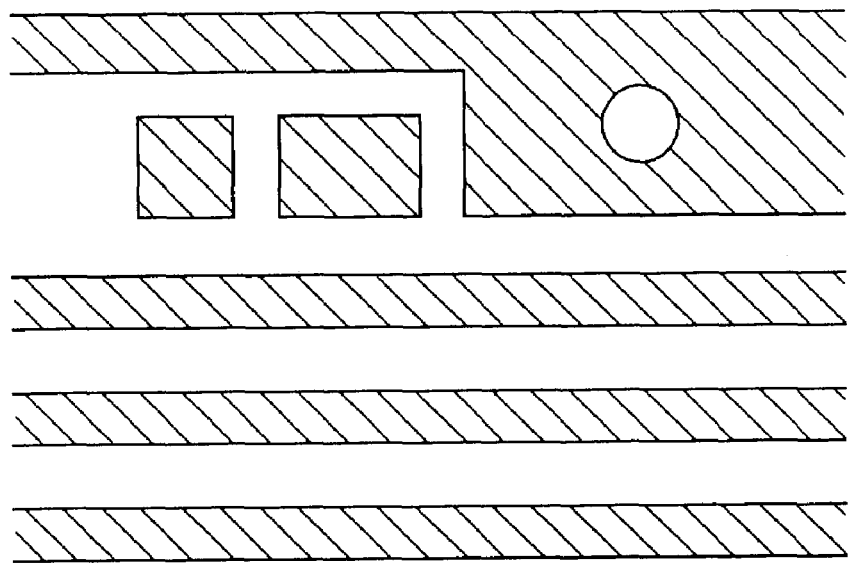
FIG.1(b)
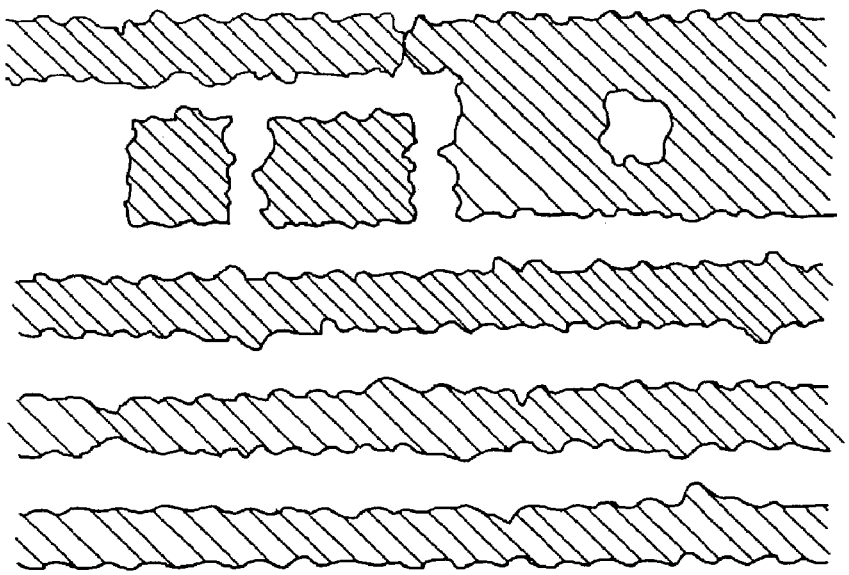

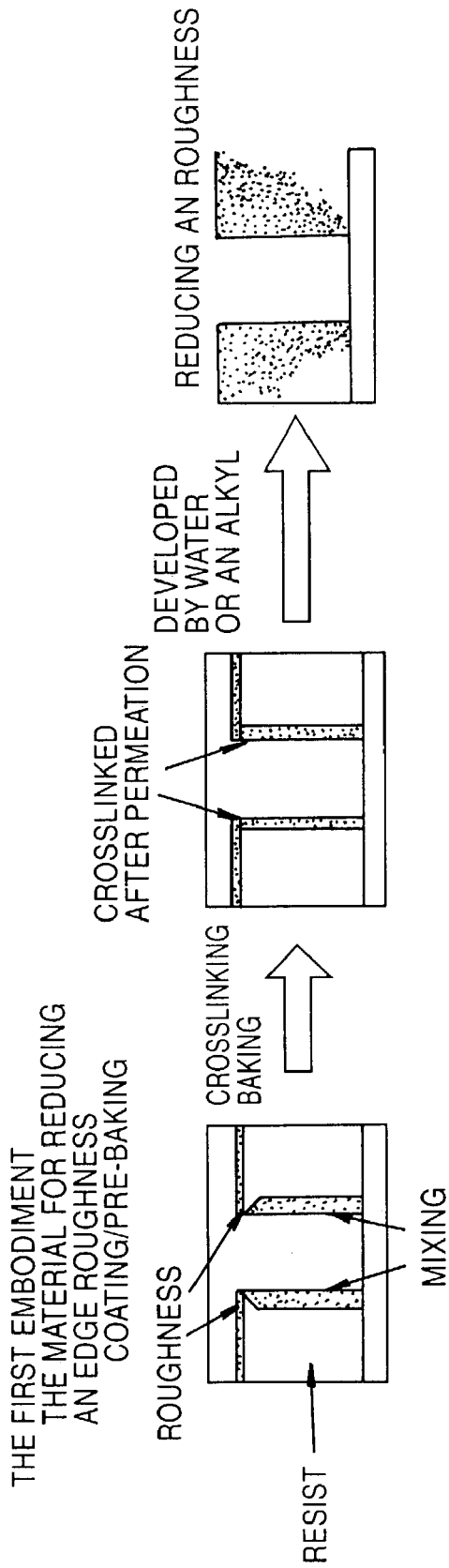

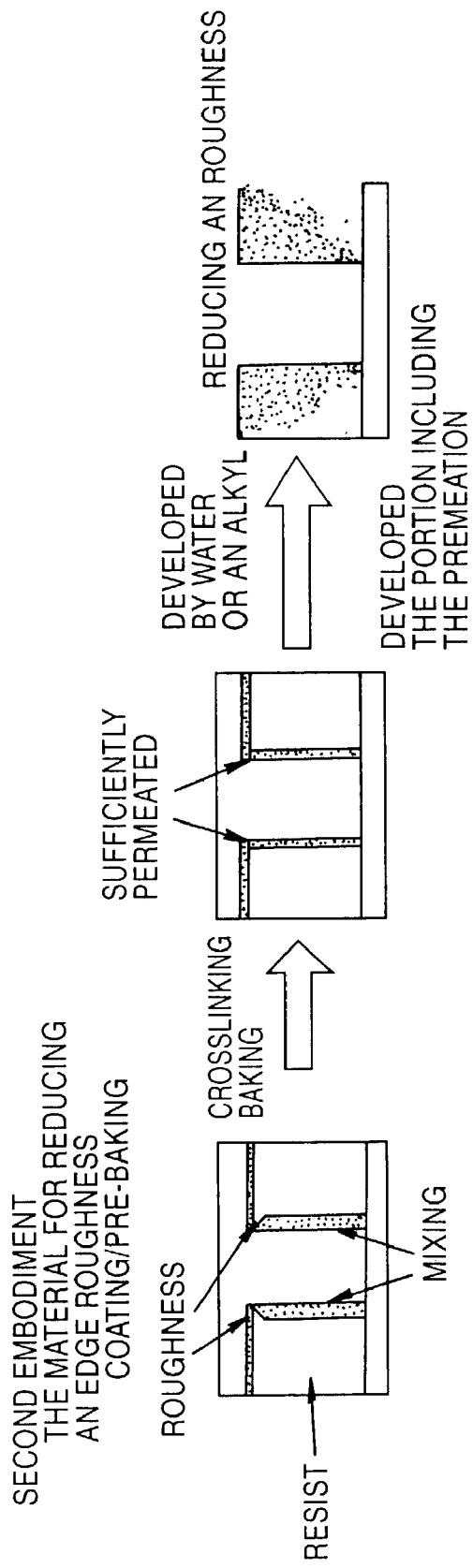

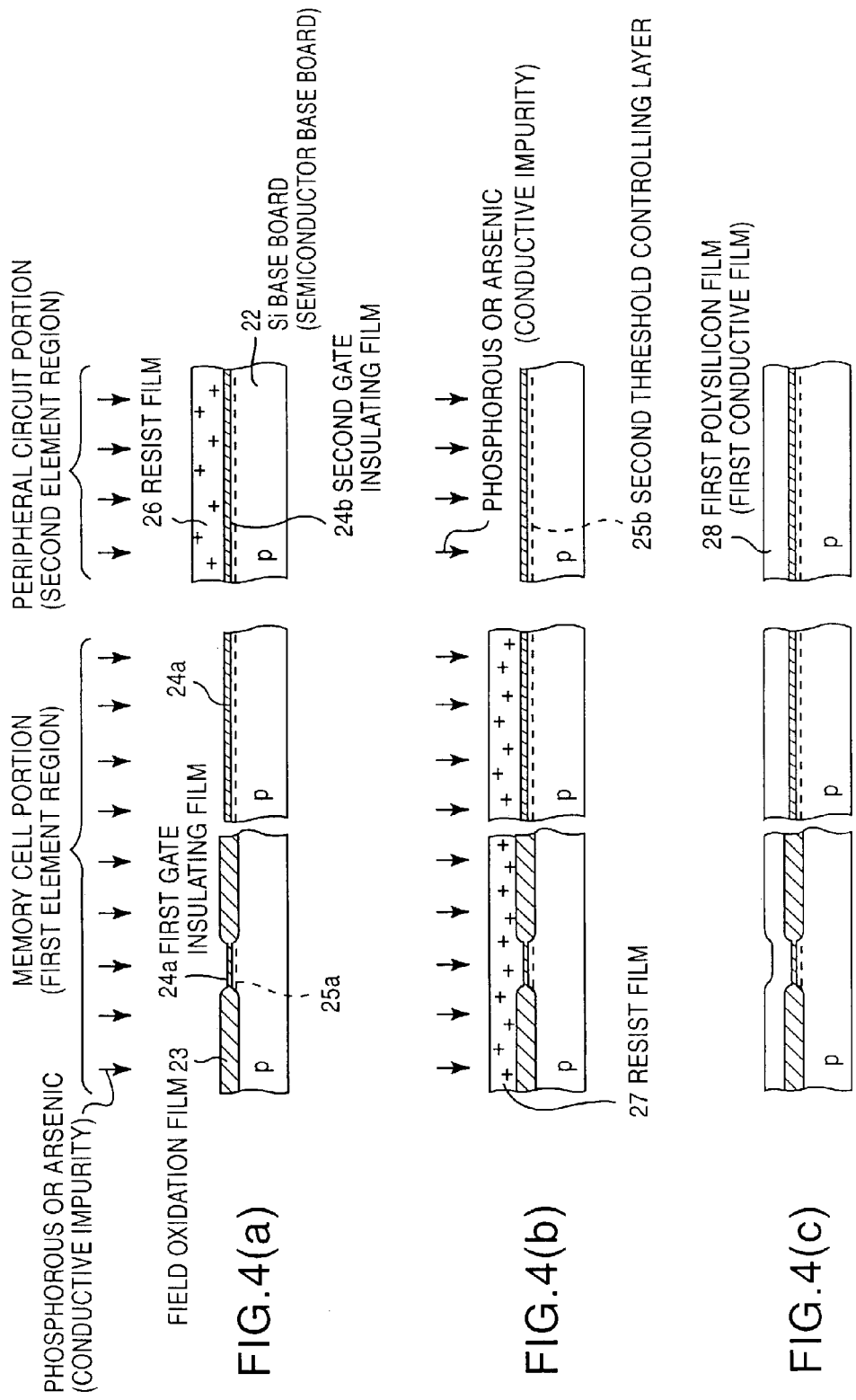

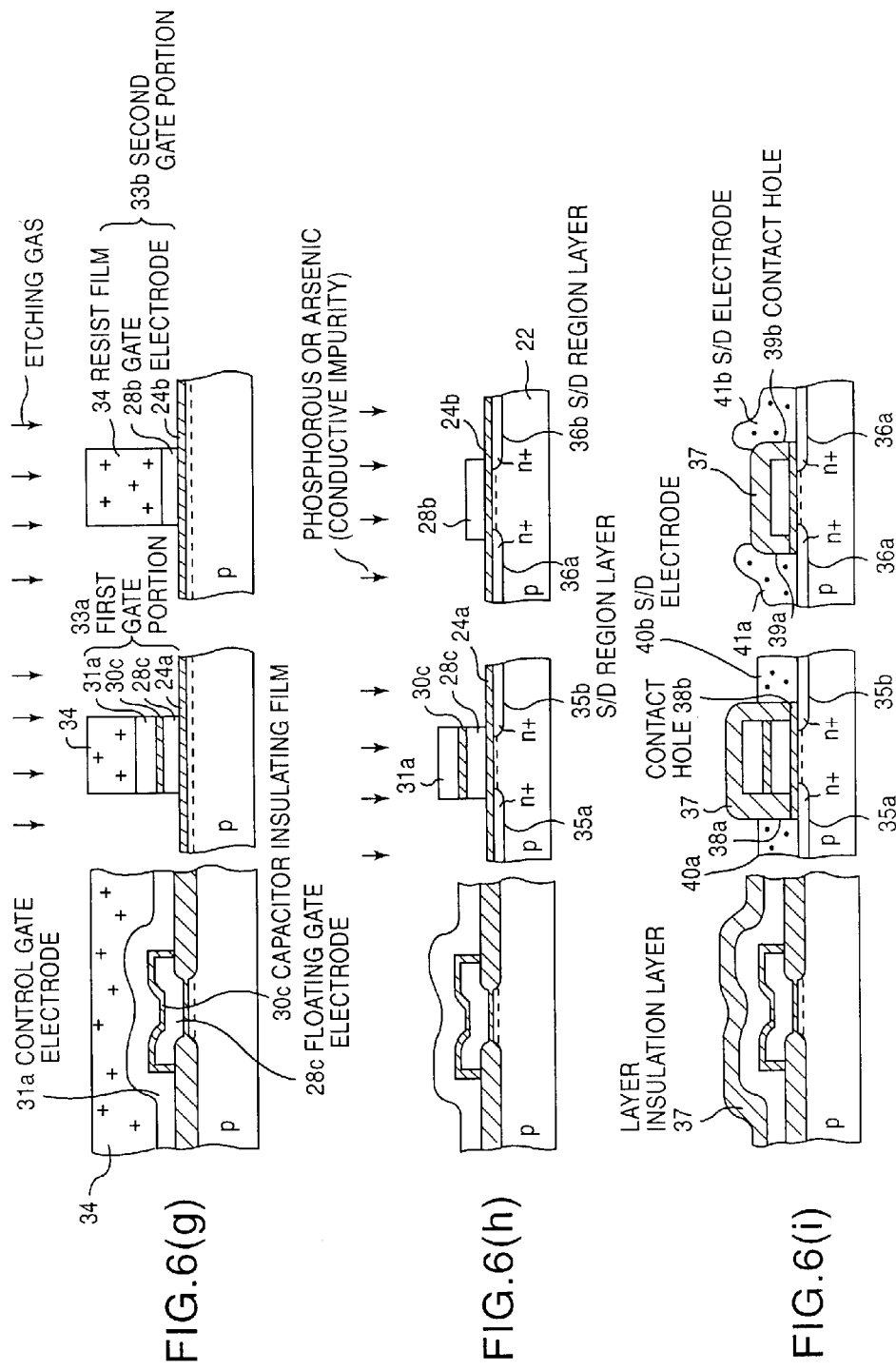

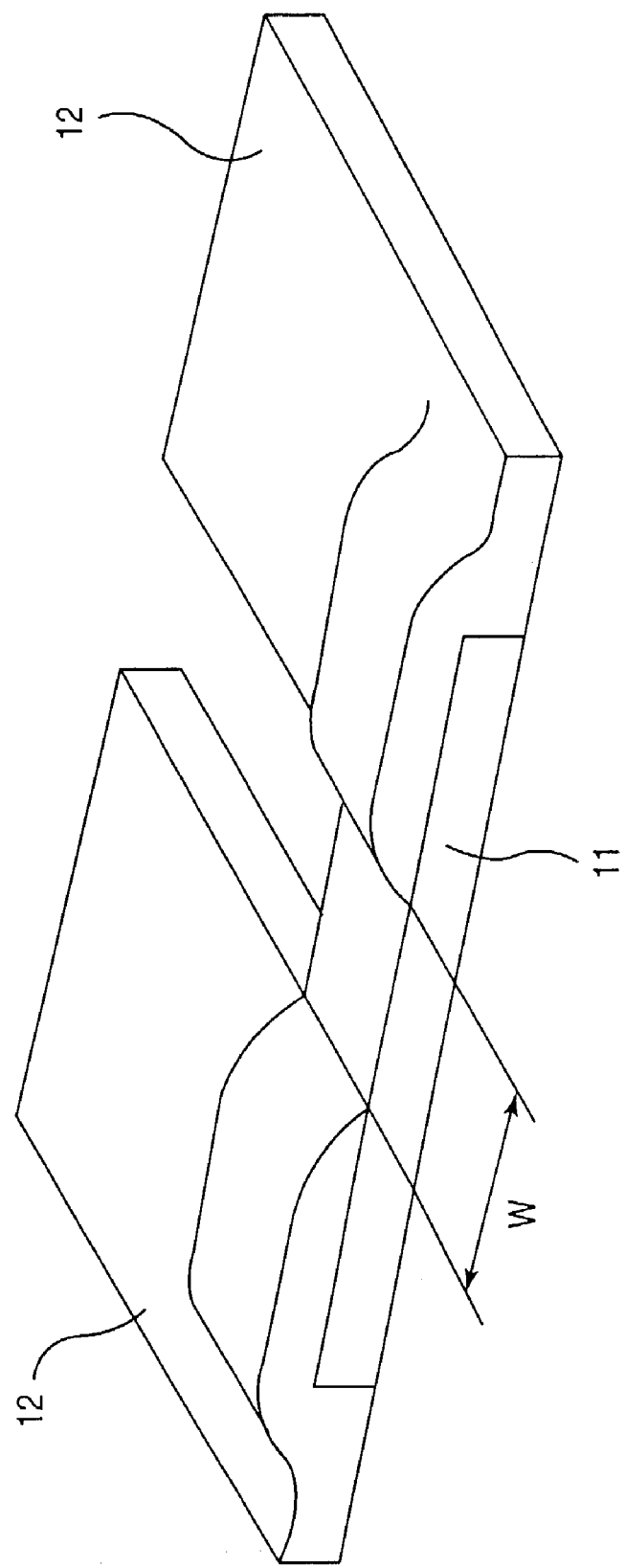

RESIST PATTERN-IMPROVING MATERIAL AND A METHOD FOR PREPARING A RESIST PATTERN BY USING THE SAME

CROSS-REFERENCE TO RELATED APPLICATION

This application is based upon and claims the benefit of priority from the prior Japanese Patent Application No. 2002-59429, filed on Mar. 5, 2002, the entire contents of which are incorporated herein by reference.

FIELD OF THE INVENTION

The present invention relates to a resist pattern-improving material and a method for preparing a pattern by using the same. The present invention, in particular, relates to an improvement for forming a coating layer on the surface of the resist pattern by photo irradiation, and intermixing the coating layer with the surface of the resist pattern, and thereby reducing an edge roughness of the pattern. Such a pattern is used in semiconductor devices, magnetic sensors, various functional parts, and so on.

RELATED ART

Photo irradiation techniques are generally efficient for mass production. In order to continue to improve the efficiency of mass productivity, there has been a demand to use the photo irradiation techniques in processing for preparing smaller and finer products. Therefore, studies have been conducted not only for selecting a far ultraviolet ray having a shorter wavelength than ever as an irradiation light, but also for improving mask patterns, shapes of the light source, and so on. There is a demand to develop an improvement that is easily carried out by a user and that makes it possible to continue to apply such photo irradiation techniques for precisely drawing a finer pattern than ever.

When irradiating by using a KrF (krypton fluoride) excimer laser, which is generally used in the latest manufacturing process for semiconductor devices, the minimum resolution pattern size of 130 nm is about to be accomplished, and if it is combined with a super resolution technology, a minimum resolution pattern size of less than 130 nm is possible. In the next generation of the photo irradiation techniques in the mass production, the means of the photo irradiation is considered to select an ArF (argon fluoride) excimer laser having a shorter wavelength than ever. When using the ArF (argon fluoride) excimer laser, it may be possible to realize making a pattern in the level of 70 to 80 nm. However, when using a far ultraviolet ray having a shorter wavelength than ever as an irradiating light, edge roughness is unavoidable: that is, the smaller or finer the resist pattern is designed, the more the edge of the resist pattern is waved, although the edge is designed to be formed in a line shape. In other words, when resist pattern is drawn by irradiation of a far ultraviolet ray, a small and fine resist pattern may be expected, and the pattern has a line shape with a very little width. However, as the whole of the device size is reduced and the width of the pattern is narrowed, the edge roughness is relatively increased compared with the total of the width of the pattern. The current devices used in the type of the latest generation on the average have an edge roughness in the amount of ±5%, which is said to be a conspicuous level. It is necessary or essential to consider and create a measure to reduce the amount of the edge roughness. Otherwise, short circuit or disconnection of the pattern may be generated in the next step of the surface preparation step. As a result, the edge roughness will significantly affect the yield of the product. With reference to FIG. 1, this problem is explained more in detail. See FIG. 1.

FIG. 1 shows plan views of a pattern in the middle of preparing a semiconductor device, which illustrate the objectives in the conventional process. FIG. 1 (a) shows a plan view of a pattern to be drawn in accordance with the design, and FIG. 1(b) shows a plan view of an actual drawn pattern, which has an edge roughness as shown.

In the conventional way, the slashed portions shown in the figures are where a conductive film is formed. At the previous step, not shown in the figures, the conductive film is coated on the whole of the surface thereof. Then, a resist film is formed and patterned by means a photolithographic technique, which is well known in the art. Since the edge roughness is generated in this process as shown, the resist pattern results in waving, which should be a line shape. Then, such a resist pattern is used as a mask. However, such a resist pattern accompanied with the edge roughness is not appropriate for precisely etching the conductive film and patterning by remaining the portion of the slashed portions as shown. The etched pattern of the conductive film is significantly waved as shown in FIG. 1(b). In the worst case, disconnection or short circuit will occur in the pattern. Recently, the use of copper wiring has become widespread, especially in the latest fine logic devices. However, if a pattern is formed by being transferred by the resist pattern having the edge roughness, it will be difficult to cover a copper diffusion prevention film of such a copper wiring, resulting in significantly affecting the following steps after the lithography step or resulting in loss of reliability of the device.

Improvement of several resist materials has led to reduction in the edge roughness, and up to now, the issue of the edge roughness has not been raised as an industrial problem. However, the resist pattern has recently been demanded to have a resolution less than the wavelength. Also, there has been a demand to improve other performance parameters, such as sensitivity. These improvements may compromise the reduction of the edge roughness. Therefore, it has been more difficult to reduce the edge roughness while improving the other properties.

Moreover, in the next generation of the devices, the resist pattern by means of lithography will be demanded to be much smaller and finer than ever. In such applications, the ratio of the edge roughness generated in the resist pattern will be relatively increased, since the size of the resist pattern will be smaller and smaller or finer. As a result, the edge roughness will more affect the quality of the devices than ever, especially at the step after forming the resist pattern, such as, an etching step or wiring step, resulting in causing short circuit of the wiring or disconnection of the pattern.

THE OBJECTIVES OF THE INVENTION

Therefore, there is an objective to be solved in this invention. That is a reduction of an edge roughness during forming a fine pattern, which was difficult to avoid only by improving a resist material. Such an objective is solved by that after patterning a resist film, a coating film is formed on the resist film, so as to intermix the resist film material with the coating film material at the interface therebetween to reduce the edge roughness. In addition to reducing the edge roughness, there is also an objective to keep or improve etching resistance, not only by using a resist material which is used for irradiation by means of a light source having a wavelength in the field of a deep ultraviolet, such as, an ArF (argon fluoride) excimer laser, but also by using a resist material which is used for irradiation by means of a light source, such as, KrF (krypton fluoride) excimer laser, and which is known to have superior etching resistance.

BRIEF DESCRIPTION OF THE FIGURES

FIGS. 1(a) and (b) show plan views for illustrating processes for preparing a semiconductor devices, to point out the problems in the conventional steps.

FIG. 2 shows (first) cross-sectional views of the process, for illustrating the principle of the present invention.

FIG. 3 shows (second) cross-sectional views of the process, for illustrating the principle of the present invention.

FIGS. 4(a), (b) and (c) show (first) cross-sectional views for illustrating a method for preparing an EEPROM as one of the applications of the present invention.

FIGS. 6(g), (h), and (i) show (third) cross-sectional views for illustrating a method for preparing an EEPROM as one of the applications of the present invention.

FIG. 18 generally shows an MR element portion in a magnetic head (MR head), as an example.

SUMMARY OF THE INVENTION

Figure 5D:
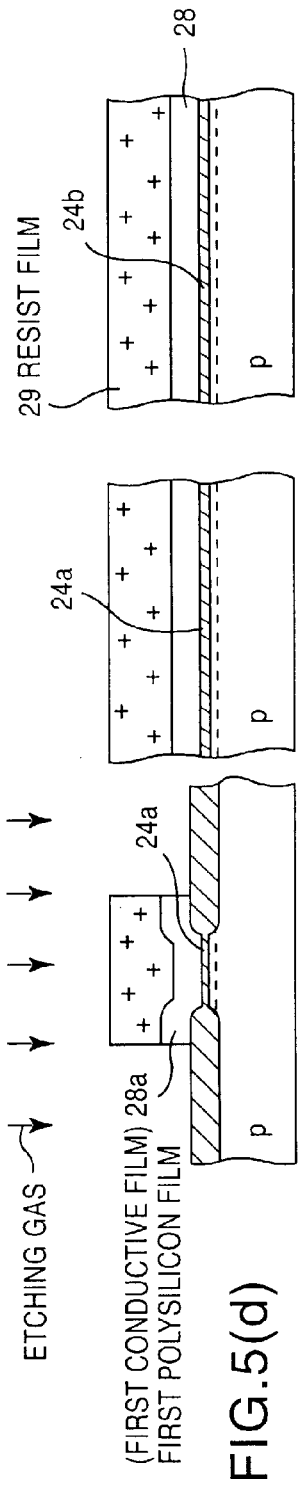
FIGS. 5(d), (e), and (f) show (second) cross-sectional views for illustrating a method for preparing an EEPROM as one of the applications of the present invention.

In order to solve the objectives described above, there is provided the present invention as follows.

(1) There is provided a resist pattern-improving material, comprising:
  (a) a water-soluble or alkali-soluble composition, comprising
    (i) at least one resin selected from the group consisting of polyvinyl alcohol, polyvinyl acetal and polyvinyl acetate, and
    (ii) at least one crosslinking agent selected from the group consisting of melamine derivatives, urea derivatives, and uril derivatives,
  wherein the resist pattern-improving material is coated on the surface of the resist pattern to cover it.

(2) There is provided a resist pattern-improving material in the formula defined in the paragraph (1), further including a water-soluble aromatic compound.

(3) There is provided a resin pattern-improving material in the formula defined in the paragraph (1) or (2), further including a surfactant selected from the group consisting of polyoxy ethylene-polyoxy propylene copolymer, polyoxy alkylene alkyl ethers, polyoxy ethylene alkyl ethers, polyoxy ethylene derivatives, sorbic fatty acid esters, glycerin fatty acid esters, primary alcohol ethoxylates, and phenol ethoxylates, and phenol ethoxylates.

(4) There is provided a resin pattern-improving material in the formula defined in any of the paragraphs (1) to (3), further including a solvent which does not easily dissolve a formed resist material placed therebelow.

(5) There is provided a method for reducing an edge roughness of a resist pattern, wherein after forming the resist pattern, the pattern-improving material defined in any of the paragraphs (1) to (4) is coated to cover the resist pattern. Alternatively, there is provided a method for forming a small and fine pattern by using the method for reducing the edge roughness of the resist pattern. Alternatively, there is provided a method for preparing a small device by means of using the method for reducing the edge roughness of the resist pattern. Alternatively, there is provided a method for preparing a semiconductor device by means of using the method for reducing the edge roughness of the resist pattern.

(6) There is provided a method for reducing an edge roughness, comprising:
(a) forming a resist pattern;
(b) coating a solution including a surfactant selected from the group consisting of polyoxy ethylene-polyoxy propylene copolymer, polyoxy alkylene alkyl ethers, polyoxy ethylene alkyl ethers, polyoxy ethylene derivatives, sorbic fatty acid esters, glycerin fatty acid esters, primary alcohol ethoxylates, and phenol ethoxylates, and
(c) coating a water-soluble or alkali-soluble composition, comprising:
    (i) at least one resin selected from the group consisting of polyvinyl alcohol, polyvinyl acetal and polyvinyl acetate,
    (ii) at least one crosslinking agent selected from the group consisting of melamine derivatives, urea derivatives, and uril derivatives, and
    (iii) at least one polyphenol compound selected from the group consisting of flavonoids, catechins, anthocyanidins, proanthocyanidins, tannins, quercetins, isoflavones, and derivatives thereof.

Alternatively, there is provided a method for forming a pattern by means of using the method for reducing the edge roughness of the resist pattern. Alternatively, there is provided a method for preparing a small device by means of using the method for reducing the edge roughness of the resist pattern. Alternatively, there is provided a method for preparing a semiconductor device by means of using the method for reducing the edge roughness of the resist pattern.

Next, an effect of the present invention and its principle are explained.

The inventors of the present invention have enthusiastically studied for solving the objectives stated above. In the middle of the research, the inventors of the present invention have tested various formulas while adjusting the kinds of the base resin of the resist, the molecular structures of the protective groups, the balance of hydrophobic and hydrophilic properties, and so on. Finally, the inventors of the present invention have found a formula which is able to control the variation of the resist pattern size within 10% or less, as well as to reduce the issue of the edge roughness into the level not to cause a problem with respect to manufacturing.

With reference to FIG. 2 and FIG. 3, the mechanisms of the reduction of the edge roughness, and improvement of etching resistance when further adding a water-soluble aromatic compound, according to the present invention, are explained as follows. See FIG. 2.

FIG. 2 shows a cross-sectional view of the resist pattern, for illustrating a first embodiment. In the first embodiment, the resist pattern is prepared by the process of forming a resist material on the surface of the base board to form a resist pattern, and then, spin-coating the edge roughness reducing material according to the present invention on the base board including the formed openings.

In the first embodiment, the resist pattern-improving material includes a polyvinyl acetal resin (KW-3, made by Sekisui Chemical Co., Ltd.) as a base resin, tetramethoxy methyl glycoluril as a crosslinking agent, a nonionic surfactant, pure water (deionized water), and isopropyl alcohol. After making a resist pattern, the resist pattern-improving material according to the present invention is coated, and then, pre-baking is carried out to form a coating film. At the pattern interface therebetween, the resist pattern is mixed with the improving material according to the present invention, and then, baking is carried out for crosslinking at a higher temperature than that for the pre-baking, so as to crosslink in the portion where the resist pattern is mixed with the improving material. Then it is developed in water or a weak alkali solution. The portion having a weak crosslinking or high solubility will be removed, to develop and form a fine pattern having a reduced roughness. When the resist pattern-improving material further includes a water-soluble aromatic compound, the resist pattern-improving material having the water-soluble aromatic compound is mixed with the resist pattern to crosslink each other, so as to significantly improve etching resistance, compared with a conventional material comprising polyvinyl acetal, polyvinyl alcohol, or polyvinyl acetate. See FIG. 3.

FIG. 3 shows a cross-sectional view of a resist pattern, for illustrating a second embodiment. In the second embodiment, the resist pattern is prepared by the process of forming a resist material on the surface of the base board to form a resist pattern, and then, spin-coating the edge roughness reducing material on the resist pattern including the formed openings.

In the second embodiment, the resist pattern-improving material includes a polyvinyl acetal resin (KW-3, made by Sekisui Chemical Co., Ltd.) as a base resin, a nonionic surfactant, pure water (deionized water), and isopropyl alcohol. After forming a resist pattern, the resist pattern-improving material according to the present invention is coated, and then, pre-baking is carried out to form a coating film. At the pattern interface therebetween, the resist is mixed with the improving material according to the present invention, by heating at a higher temperature than that for the pre-baking. Then, it is developed in water or a weak alkali solution. The portion having a high solubility, where the improving material according to the present invention for reducing the edge roughness has not permeated, will be removed and developed so as to form a fine pattern having a reduced roughness.

As to a resist material useful for the present invention, it is preferable to use resist materials for irradiation by a KrF excimer laser, and alicyclic type resist materials for irradiation by an ArF excimer laser. The alicyclic type resist materials may include resist materials for ArF excimer lithography, such as acrylic type resist materials having an adamantyl group on the side chain, COMA type resist materials, hybrid type (copolymer of an alicyclic acrylic type and COMA type) resist materials, cycloolefin type resist materials, and so on. However, the resist materials, which may be used in the present invention, are not limited thereto. Novolak type resist materials, PHS type chemical amplified resist materials preferably irradiated by an electron beam or EUV light source, main chain decomposing type non-chemical amplified resist materials represented by PMMA, resist materials for F2 laser lithography in which any of the above listed resist is fluorinated may be also used in the present invention. Any of the resist materials necessary for fine working may be used in the present invention. The film thickness of the resist material to be formed may be designed by the surface to be formed and an etching condition therefor, and there is no specific limitation in the present invention. However, it is preferable to form the resist material having a film thickness of 0.05 to 200 nm, which is the same as usual.

The base resin used in the present invention may include polyvinyl acetal, polyvinyl alcohol, polyvinyl acetate, the polyacrylic acid, polyvinyl pyrrolidone, polyethylene imine, polyethylene oxide, styrene-maleic acid copolymer, polyvinyl amine resin, polyallylamine, water-soluble resin having an oxazoline group, water-soluble melamine resin, water-soluble urea resin, alkyd resin, and sulfonic acid amide resin, and mixture thereof, and so on.

It is not essential to add the crosslinking agent in the second embodiment. However, the crosslinking agent may be added if necessary, and if so, it may include glycoluril type crosslinking agents; urea type crosslinking agents, such as, urea resin, alkoxy methylene urea, N-alkoxy methylene urea, ethyleneurea, ethylene urea carboxylic acid, and so on; melamine type crosslinking agents, such as, methylene, alkoxy methylene melamine, and so on; amino type crosslinking agents, such as, benzoguanamine, so long as such a crosslinking agent functions in accordance with the present invention when it is added in the material.

The water-soluble aromatic compound may include, for example, polyphenols. In detail, such polyphenols may preferably include flavonoids, catechins, anthocyanidins, proanthocyanidins, tannins, quercetins, isoflavones, and glycosides or derivatives thereof. In addition to the polyphenols as stated above, it may be also preferable to use polyhydric phenols represented by resorcin, resorcin [4] arene, pyrogallol, gallic acid, and derivatives thereof, aromatic carboxylic acids represented by salicylic acid, phthalic acid, dihydroxybenzoic acid, and derivatives thereof; naphthalene polyhydric alcohols represented by naphthalenediol, naphthalenetriol, and derivatives thereof; and benzophenone derivatives represented by alizarin yellow A. In addition, it is also possible to use various compounds which have been industrially used as a water-soluble pigment having an aromatic group.

The surfactant is not necessary to be added if the resist pattern-improving material has affinity or compatibility with the resist. However, it may be added in the following cases: the case where the resist pattern-improving material has less affinity or compatibility with the resist, the case to control the variation of the pattern size as little as possible without adding the crosslinking agent, the case to improve the uniformity of the roughness reducing property on the surface to be treated, the case for deforming, and so on. Such a surfactant may preferably be selected from the group consisting of nonionic surfactants, such as, polyoxy ethylene-polyoxy propylene copolymers, polyoxy alkylene alkyl ethers, polyoxy ethylene alkyl ethers, polyoxy ethylene derivatives, sorbic fatty acid esters, glycerin fatty acid esters, primary alcohol ethoxylates, and phenol ethoxylates. In addition, so long as using a nonionic surfactant, any nonionic surfactant other than the listed here may be used, and such alternatives will be expected to accomplish the same effect in a similar manner as stated above.

In addition to the resin, the crosslinking agent (which is not essential to the present invention), and the water-soluble aromatic compound (which is not essential to the present invention), the resist pattern-improving material according to the present invention may include at least one organic solvent selected from the group consisting of alcohols, linear esters, cyclic esters, ketones, linear ethers, and cyclic ethers If the resist pattern-improving material according to the present invention has an insufficient solubility to dissolve the solute included therein, or has an insufficient property of reducing the edge roughness, it is preferable to add such an organic solvent to the extent not to affect the forming of the resist pattern. In such a case, the organic solvent as the alcohols may include isopropyl alcohol. The organic solvent as the linear esters may include lactic acid ethyl (ethyl lactate), propylene glycol methyl ether acetate (PGMEA). The organic solvent as the cyclic esters may include lactones. In particular, it is preferable to use γ-butyrolactone. The organic solvent as the ketones may include acetone, cyclohexanone, heptanone, and so on. The organic solvent as the linear ethers may include ethylene glycol dimethyl ether, and so on. The organic solvent as the cyclic ethers may include tetrahydrofuran, dioxane, and so on. Especially, it is preferable to use an organic solvent which has a boiling point of 80 to 200° C., approximately. Fine drawing of the resist pattern may be accomplished by using such an organic solvent having the boiling point within this range.

EXAMPLE TEST 1

Preparation of a Resist Pattern-Improving Material

Various resist pattern-improving materials were prepared in accordance of the formulas shown in the Table 1 below. In Table 1, the numbers encompassed by parentheses are based on parts by weight. KW-3 made by Sekisui Chemical Co., Ltd. is used as polyvinyl acetal resin, and the surfactant used here is made by Asahi Denka Co., Ltd. Pure water (deionized water) and isopropyl alcohol in a ratio of 98 6:0.4, by weight, was mixed as the main solvent. In Table 1, "Uril" means tetramethoxy methyl glycoluril, and "Urea" means N,N'-dimethoxy methyl dimethoxy ethyleneurea, and "Melamine" means hexamethoxy methyl melamine.

TABLE 1

| The Name of the Resist Pattern-improving Material | Crosslinking Agent | Water-soluble Aromatic Compound | Surfactant |
|---|---|---|---|
| A | KW-3 (16) | Uril (0.8) | Not Included | Not Included |
| B | KW-3 (16) | Urea (1.0) | Not Included | Not Included |
| C | KW-3 (13), PVA (3) | Melamine (0.5) | Not Included | Not Included |
| D | KW-3 (16) | Uril (1.2) | Not Included | Not Included |
| E | KW-3 (16) | Uril (0) | Not Included | Not included |
| F | KW-3 (16) | Uril (1.0) | Not Included | Not Included |
| G | KW-3 (16) | Uril (1.0) | Not Included | TN-80 (0.0625) |
| H | KW-3 (16) | Uril (1.0) | Not Included | TN-80 (0.125) |
| I | KW-3 (16) | Urea (1.0) | catechin (5) | Not Included |
| J | KW-3 (16) | Urea (1.0) | catechin (5) | PC-8 (0.05) |

While coating the resist pattern-improving material to form a film, spin-coating is carried out in the process of rotating at a speed of 1000 rpm for a period of 5 seconds followed by rotating at a speed of 3500 rpm for a period of 5 seconds. In the baking step, the sample is heated at a temperature of 85° C. for a period of 70 seconds, followed by heating at a temperature of 90 to 100° C. for a period of 70 seconds. Then, the sample was washed with pure water for a period of 60 seconds so as to remove a non-crosslinked portion.

EXAMPLE TEST 2

Test for Reducing the Edge Roughness of the Resist Pattern

The various resist pattern-improving materials prepared in accordance with Example 1 were used here. 150 nm space pattern, which were formed by using an alicyclic resist for ArF lithography, were treated in this example. As a result, the patterns which had improved roughness were obtained.

TABLE 2

| The Name of the Resist Pattern-improving Material | Initial Roughness Size (3 sigma, nm) | Roughness Size after the Treatment (3 sigma, nm) | Increased Amount of the Size (nm) |
|---|---|---|---|
| A | 16.0 | 12.2 | 10.8 |
| B | 16.0 | 10.0 | 9.1 |
| C | 16.0 | 8.5 | 6.5 |
| D | 16.0 | 6.0 | 6.8 |
| E | 16.0 | 15.0 | 9.2 |
| F | 16.0 | 11.0 | 7.4 |
| G | 16.0 | 5.8 | 9.1 |
| H | 16.0 | 5.5 | 13.8 |
| I | 16.0 | 11.3 | 5.8 |
| J | 16.0 | 7.1 | 10.9 |

EXAMPLE TEST 3

Test for Reducing the Edge Roughness of the Resist Pattern

The various resist pattern-improving materials prepared in accordance with Example 1 were used here 150 nm hole patterns, which were formed by using an alicyclic resist for ArF lithography, were treated in this example. As a result, the patterns which had improved roughness were obtained.

TABLE 3

| The Name of the Resist Pattern-improving Material | Initial Roughness Size (3 sigma, nm) | Roughness Size after the Treatment (3 sigma, nm) | Increased Amount of the Size (nm) |
|---|---|---|---|
| A | 8.2 | 7.5 | 17.5 |
| B | 8.2 | 6.8 | 3.0 |
| C | 8.2 | 5.9 | 11.5 |
| D | 8.2 | 4.0 | 1.8 |
| E | 8.2 | 8.0 | 7.3 |
| F | 8.2 | 7.8 | 16.8 |
| G | 8.2 | 4.2 | 1.6 |
| H | 8.2 | 4.1 | 6.8 |
| I | 8.2 | 7.7 | 4.8 |
| J | 8.2 | 4.5 | 8.8 |

From the results of Example 2 and Example 3, the effect of reducing the edge roughness indicates that the resist pattern-improving material according to the present invention is applicable either for lined patterns and holed patterns

EXAMPLE TEST 4

Etching Resisitance

The resist films having a thickness of 0.5 micron were formed on a silicon wafer, and then treated by the resist pattern-improving materials D, H, I prepared in the previous Example. For comparison, as a KrF resist, a sample formed from UV-6 made by Shiplay Corporation, and a sample formed from PMMA (polymethyl methacrylate) were prepared. Using an RIE equipment in the type of parallel electrodes, each sample was etched under the conditions of RF power=200 W, at a pressure of 0.02 Torr, using $CF_4$ gas for a period of 3 minutes. Then, the amounts of reduced film thickness were compared.

TABLE 4

| The Material Name | Etching Plate (Å/s) | Ratio |
|---|---|---|
| UV-6 | 627 | 1.00 |
| PMMA | 770 | 1.23 |
| I | 650 | 1.04 |
| J | 662 | 1.06 |

The results listed above show that the etching resistance of the resist pattern-improving material according to the present invention is similar to that of the KrF resist, and significantly improved compared with PMMA.

EXAMPLE TEST 5

Application to an Electron Ray

PMMA (polymethyl methacrylate) was used as a resist material, and 100 nm space patterns were formed by an electron beam exposure apparatus (50 KeV). The resist were treated to obtain patterns having a reduced roughness as follows.

TABLE 5

| Resist Pattern | Initial Roughness Size (3 sigma, nm) | Roughness Size after the Treatment (3 sigma, nm) | Increased Amount of the Size (nm) |
|---|---|---|---|
| A | 18.0 | 14.5 | 7.8 |
| B | 18.0 | 12.0 | 8.0 |
| C | 18.0 | 11.2 | 4.2 |
| D | 18.0 | 8.0 | 4.3 |
| E | 18.0 | 16.5 | 5.9 |
| F | 18.0 | 13.5 | 9.3 |
| G | 18.0 | 6.3 | 7.8 |
| H | 18.0 | 6.1 | 22.3 |
| I | 18.0 | 14.1 | 4.3 |
| J | 18.0 | 9.1 | 9.2 |

The results show that the resist pattern-improving material according to the present invention does not restrict the selection of the type of the resist material, and may be applicable either to chemical amplified type resist materials and chemical non-amplified type resist materials.

EXAMPLE TEST 6

Application to a Two Layers for Irradiating an Electron Ray

PMMA (polymethyl methacrylate) was coated to have a thickness of 0.15 micron, to form a first layer as a resist. Then, ZEP-520A was coated thereon to have a thickness of 0.15 micron, to form a second layer. Thereby obtained sample boards were subjected to photo irradiation at the space patterns by electron beam exposure apparatus (50 KeV). Development was performed in MIBK (methyl isobutyl ketone) for 60 seconds, so as to obtain a pattern having a width of 100 nm. Thereby obtained resist was subjected to treatment using the resist pattern-improving materials D, G, H, which had indicated preferable results obtained in Example 7. The results obtained in this Example show that no affect was found on the upper layer, ZEP layer. However, the lower layer, PMMA layer, was affected, and the edge roughness of the pattern is reduced.

The examples described above show that the resist pattern-improving material according to the present invention may be useful in various applications. Several applications of the present invention stated hereinafter are based on the fact revealed by these Example Tests. The present invention will be explained with respect to a method for preparing a flash type EEEPROM, a method for preparing a magnetic sensors and a method for preparing a PDP (Plasma Display Panel). However, the present invention may be applicable to any other applications in which a fine pattern is necessary, and is not limited thereto. As the other applications, a method for preparing functional parts, such as, mask pattern, rectil pattern, LCD (liquid crystalline display), SAW filter (Surface Acoustic Wave filter), and so on; a method for preparing optical parts used for connecting optical wiring; a method for preparing fine and small parts, such as, micro-actuator, and so on may be included. Also, as an example of a method for preparing semiconductor devices, a process for preparing a flash memory will be explained in detail, but the present invention is not limited thereto. The present invention may be also applicable to a method for preparing a logic device, DRAM, FRAM, and so on, and same effect will be expected in a manner as stated above.

DETAILED DESCRIPTION OF THE INVENTION

The technology of the resist pattern-improving material according to the present invention may be useful for various applications, among which several methods for preparing various devices are explained here.

(1) First Application Example of the Present Invention: A Method for Preparing a Flash Memory There is provided a method for preparing a flash memory. This is an example for preparing a semiconductor device, which may be preferable to incorporate the step for forming a pattern according to the present invention. For example, the resist pattern-improving material according to the present invention may be used in the step of forming a holed pattern, which may contribute to reduce an edge roughness of the resist pattern, and thereby, the size of the inner diameter of the holed pattern, the width between the linier patterns and/or separated patterns, and the interval between the linear patterns, and so on, may be controlled within the allowable range As shown in FIG. 4(a), a field oxide film 23 of $SiO_2$ is selectively formed on an element separation region on a p-type silicon wafer. Then, a first gate insulation film 24a of a MOS transistor located in a memory cell portion (a first element region), is formed by heat oxidation in a step, the first gate insulating film 24a having a film thickness of 100 to 300 Å, and a second gate insulation film 24b of a MOS transistor located in a peripheral circuit portion (a second element region) is formed by heat oxidation in another step, the second gate insulating film 24b having a film thickness of 100 to 500 Å. However, if both of the first and second gate insulation films 24a, 24b are designed to have the same thicknesses, those oxidation films may be concurrently formed in one step.

Then, a MOS transistor having a type of n-type depression channel is formed on the memory cell portion. In order to control a threshold voltage, the peripheral portion is masked by a resist film 26, and then, phosphorous (P) or arsenic (As) as an n-type impurity is incorporated into a portion to be a channel region which will be located right below a floating gate electrode, by means of ion implantation at a dose amount of $1\times10^{11}$ to $1\times10^{14}$ $cm^{-2}$, and thereby, a first threshold controlling layer 25a is formed. At that time, the dose amount and the selection of the conductive type of the impurity may be determined according to whether it is a depression type or accumulation type.

Then, a MOS transistor having a type of n-type depression channel is formed on the peripheral circuit portion. In order to control a threshold voltage, the memory cell portion is masked by a resist film 27, and then, phosphorous (P) or arsenic (AS) as an n-type impurity is incorporated into a portion to be a channel region which will be located right below a gate electrode, by means of ion implantation at a dose amount of $1\times10^{11}$ to $1\times10^{14}$ $cm^{-2}$, and thereby, a second threshold controlling layer 25b is formed See FIG. 4(b)

Following the above, a first polysilicon film (first conductive layer) 28 is formed on the whole of the surface, the first polysilicon film having a film thickness of 500 to 2000 Å. The first polysilicon film will be a floating gate electrode of a MOS transistor in the memory cell portion, and a gate electrode of a MOS transistor in the peripheral circuit portion. See FIG. 4(c).

Figure 7A:
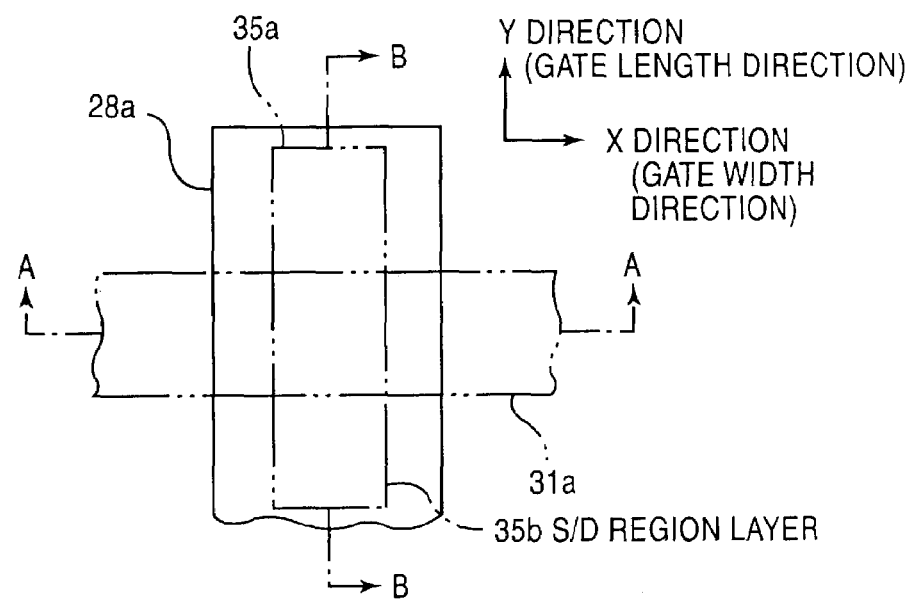
FIGS. 7(a) and (b) show (fourth) cross-sectional views for illustrating a method for preparing an EEPROM as one of the applications of the present invention.

Then, a resist film 29 is used as a mask on the first polysilicon film 28 to make a pattern, and thereby, the floating gate electrode 28a is formed on the MOS transistor in the memory cell portion. See FIG. 5(d). At that time, as shown in FIG. 7(a), the patterning is performed in a manner such that the width in the direction of "X" is a final size, without patterning in the direction of "Y" to continue to cover the region to be a source drain region.

Then, the resist film 29 is removed, followed by that the floating electrode 28a is covered by means of heat oxidation so as to form a capacitor insulation film 30a of $SiO_2$ having a film thickness of 200 to 500 Å. At that time, the $SiO_2$ film 30b of is formed concurrently on the first polysilicon film 28 of the peripheral circuit portion. Optionally, a couple of layers, including $SiO_2$ and $Si_3N_4$ films may be formed as the capacitor insulation film. Then, the floating gate electrode 28a and the capacitor insulation film 30a are covered to form a second polysilicon film (second conductive film) 31 having a film thickness of 500 to 2000 Å, which will be a control gate electrode. See FIG. 5(e).

Following the above, the memory cell portion is masked by a resist film 32, and then, the second polysilicon film 31 and the $SiO_2$ film 30b in the peripheral circuit portion are continuously removed to reveal the first polysilicon film 28. See FIG. 5(f).

Figure 7B:
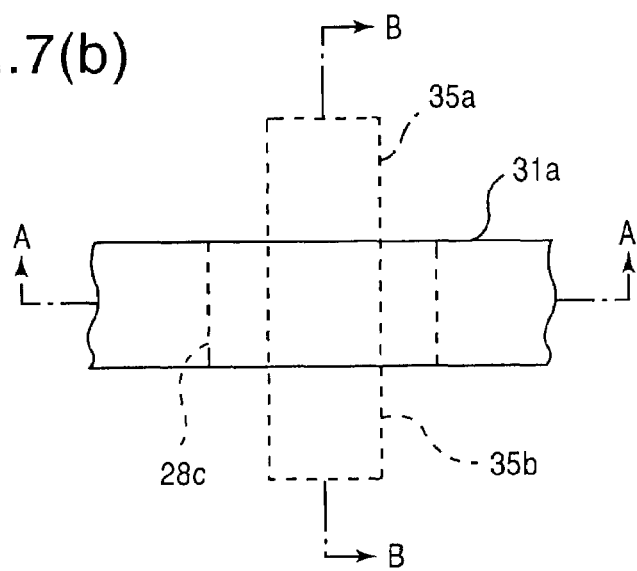

Then, the second polysilicon film 31, the $SiO_2$ film 30b, and the first polysilicon film 28a patterning only in the direction of "X", which is located in the memory cell portion, are masked with a resist film 32, followed by that patterning is performed in the direction of "Y" to have a final size of a first gate portion 33a. The control gate electrode 31a, the capacitor insulation film 30c, and the floating gate electrode 28c are formed to have a width in the direction of "Y" being about 1 μm. The first polysilicon film 28 in the peripheral portion is masked with a resist 32, and then, patterning is carried out to have a final size of a second gate portion 33b, so as to obtain a gate electrode 28b having a width of about 1 μm. See FIG. 6(g) and FIG. 7(b).

Then, while operating the control gate electrode 31a, capacitor insulation film 30a, and floating gate electrode 28a in the memory cell portion as a mask, phosphorous (P) or arsenic (As) is incorporated into the Si base board 22 of an element forming region at a dose amount of $1\times10^{14}$ to $1\times10^{16}$ $cm^{-2}$, so as to obtain an n-type source drain region 35a, 35b. Also, while operating the gate electrode 28b in the peripheral portion as a mask, phosphorous (P) or arsenic (As) is incorporated into the Si base board 22 of an element forming region at a dose amount of $1\times10^{14}$ to $1\times10^{16}$ $cm^{-2}$, so as to obtain a S/D region layer 36a, 36b. See FIG. 6(h).

Then, a layer insulation film 37 of a PSG film having a film thickness of 5000 Å, approximately, is formed to cover the first gate portion 33a in the memory cell portion and the second gate portion 33b in the peripheral circuit portion. Subsequently, contact holes 38a, 38b, 39a, 39b are formed on the layer insulation film 37 above the source drain region layers 35a, 35b, 36a, 36b, and then, S/D electrodes 40a, 40b, 41a, 41b are formed to complete a flash type EEPROM. See FIG. 6(i).

Figure 5E:
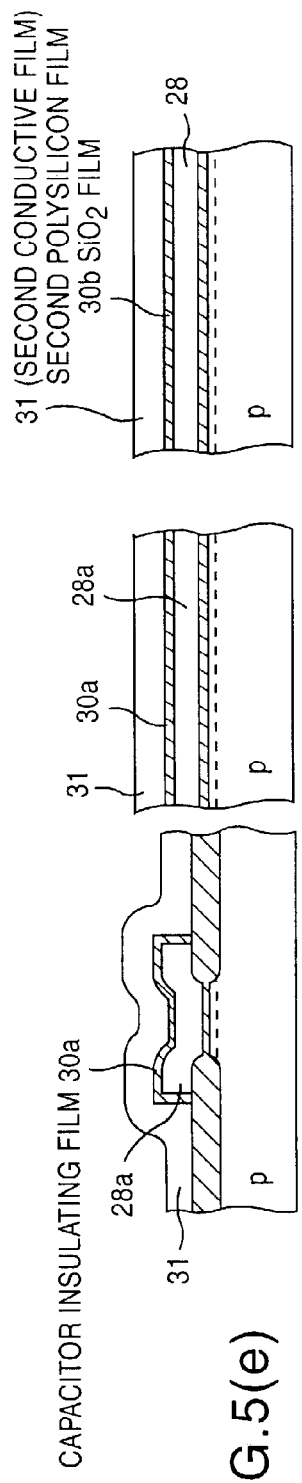

As described above, in the first application example of the present invention, the patterned first polysilicon film 28a in the memory cell portion is covered with the capacitor insulation film 30a, as shown in FIG. 5(e). Then, the second polysilicon film 31 is formed on the memory cell portion and peripheral circuit portion, and then, as shown in FIG. 6(g), patterning is continuously performed to form the first gate portion 33a comprising the first gate insulation film, 24a, floating gate electrode 28c, and capacitor insulation film 30c, and control gate electrode 31a.

Therefore, the formed capacitor insulation film 30c is completely protected by the first and second polysilicon films 28a, 31. See FIG. 5(e) and (f). Thus, the capacitor insulation film 30c is prevented from contaminating any particles and the like, so as to form a capacitor insulation film 30c for covering the floating gate electrode 28c in a good quality.

In addition, the formed second gate insulation film 24b in the peripheral circuit portion, is completely covered with the first polysilicon film 28 See FIG. 4(c) to FIG. 5(f). Thus, the second gate insulation film 24b continues to have the same film thickness since it was formed As a result, it is easy to control the film thickness of the second gate insulation film 24b. Also, it is easy to adjust the concentration of the conductive impurity for controlling the threshold voltage.

In the first application example, the first gate portion 33a is formed by patterning in the direction of the gate width to have a width in the direction thereof, and then, patterning in the direction of the gate length, so as to obtain a final gate width. Alternatively, the first gate portion 33a is formed by patterning in the direction of the gate length to have a width, and then in the direction thereof, patterning in the direction of the gate width in the direction thereof, so as to obtain a final gate width.

Figures 8A, 8B, 8C:
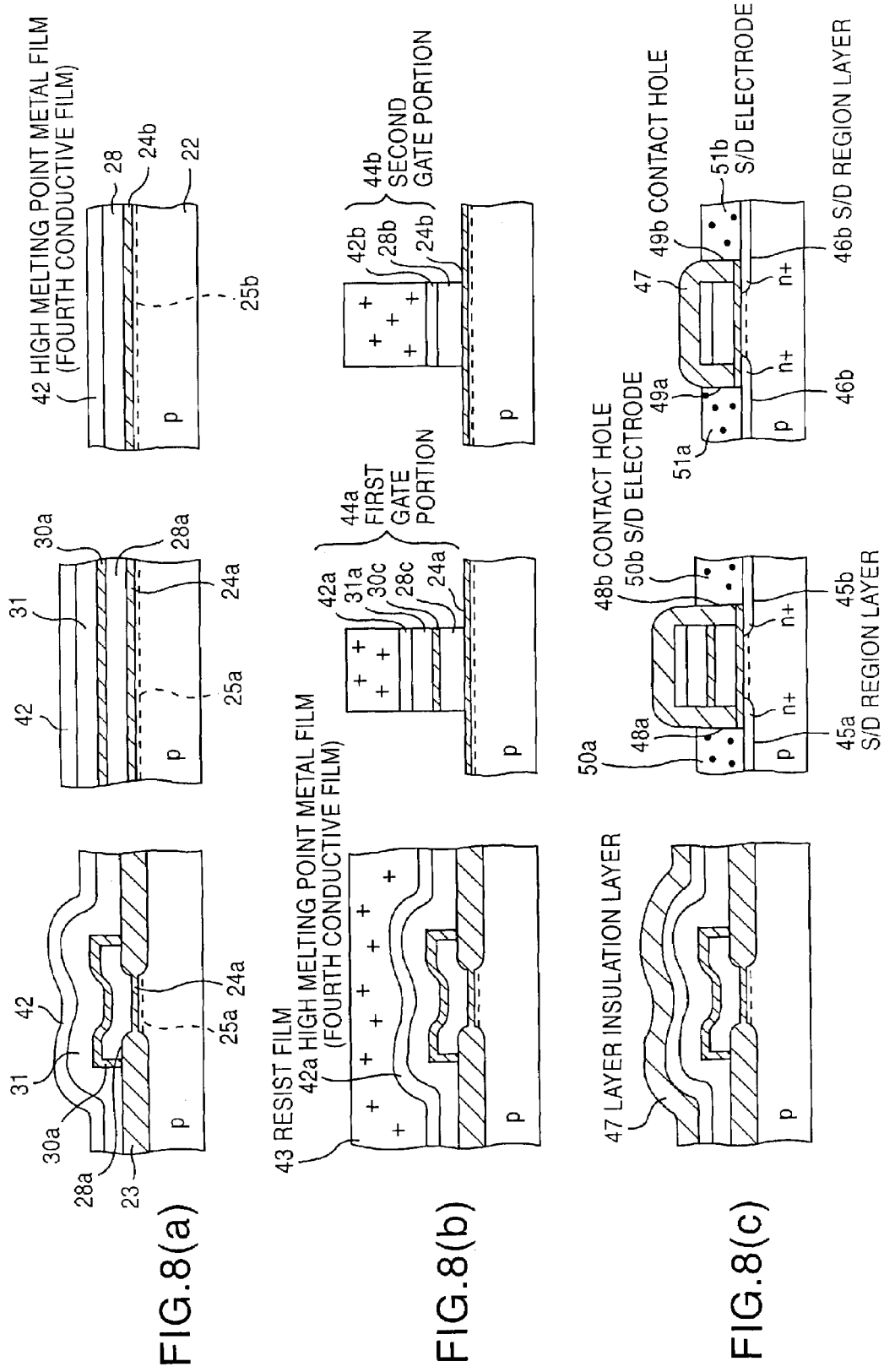
FIGS. 8(a), (b), and (c) show (fifth) cross-sectional views for illustrating a method for preparing an EEPROM as one of the applications of the present invention.

(2) The Second Application Example: A Method for Preparing a Flash Memory FIGS. 8(a) to (c) show cross-sectional views for illustrating a method for preparing a flash type EEPROM referred to as "FLOTOX Type" or "ETOX Type", as the second application example of the present invention. The left figures show cross-sectional views illustrating a memory cell portions shown in the direction of "X" (gate length), where a MOS transistor is formed having a floating gate electrode. The central figures show cross-sectional views of the memory cell portion in the left figures, shown in the direction of "Y" (that is a gate width direction perpendicular to the "X" direction). The right figures show cross-sectional views of a MOS transistor in a peripheral circuit portion.

Figure 5F:
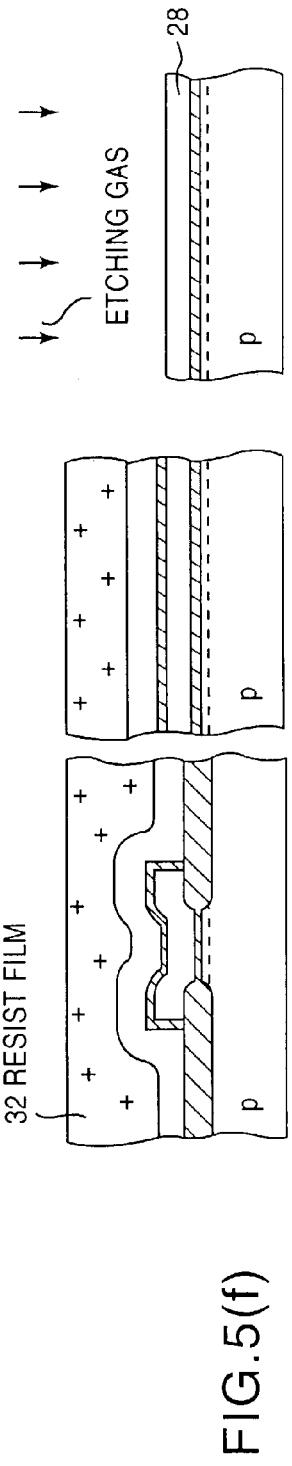

The points of the second application example, which are different from the first application, are as follows. FIG. 5(f) is for the first application example. After the step shown in FIG. 5(f), the second application example has a step of forming a metal film 42 having a high melting temperature (fourth conductive film) 42, such as, a W or Ti film having a film thickness of about 2000 Å, on the first polysilicon film 28 in the peripheral circuit portion and the second polysilicon film 31 in the memory cell portion, and thereby obtaining a polyside film. Subsequent to the above, the second application example includes the similar steps shown in FIGS. 6(g) to (i) to complete a flash type EEPROM. That is, while using the resist film 43 as a mask with respect to the high melting temperature metal film 42, the second polysilicon film 31, the $SiO_2$ film 30b, and the first polysilicon film 28a pattered only in the direction of "X". Then, patterning in the direction of "Y" is performed to have a final size of the first gate portion 44a, so as to form a control gate electrode 42a, 31a, capacitor insulation film 30c, and floating gate electrode 28c, having a width in the direction of 'Y" of about 1 µm, on the memory cell portion. In addition, while using the resist film 43 as a mask with respect to the high melting temperature metal film 42 and first polysilicon film 28, patterning is performed to have a final size of the second gate portion 44b, so as to form a gate electrode 42b, 28b having a width of 1 µm, approximately, on the peripheral circuit portion. See FIG. 8(b).

Then, while using the control gate electrode 42a, 31a, capacitor insulation film 30a, and the floating gate electrode 28a of the memory cell portion as a mask, phosphorous (P) or arsenic (As) is incorporated by means of ion implantation into the Si base board 22 of an element forming region at a dose amount of $1 \times 10^{14}$ to $1 \times 10^{16}$ cm$^{-2}$, so as to obtain an n-type source drain region 45a, 45b. Also, while using the gate electrode 42b, 28b in the peripheral circuit portion as a mask, phosphorous (P) or arsenic (As) is incorporated by means of ion implantation into the Si base board 22 of an element forming region at a dose amount of $1 \times 10^{14}$ to $1 \times 10^{16}$ cm$^{-2}$, so as to obtain a source drain region layer 46a, 46b.

Then, a layer insulation film 37 of a PSG film having a film thickness of 5000 Å, approximately, is formed to cover the first gate portion 44a in the memory cell portion and the second gate portion 44b in the peripheral circuit portion. Subsequently, contact holes 48a, 48b, 49a, 49b are formed on the layer insulation film 47 above the source drain region layers 45a, 45b, 46a, 46b, and then, S/D electrodes 50a, 50b, 51a, 51bare formed to complete a flash type EEPROM. See FIG. 8(c). The same portions as described in the first application example are shown by the same symbols as used in the first application example.

According to the second application example of the present invention, a high melting temperature metal film 42a and 31a is formed on the polysilicon film for the control gate electrode 42a, 31a, and the gate electrode 42b, 28b, resulting in further reducing electrical conductivity.

In addition, in the second application example described here, a high melting temperature metal films 42a, 42b are used as the fourth conductive film on the polysilicon film. However, a high melting temperature metal silicide such as titanium silicide (TiSi) may be used.

Figure 9A:
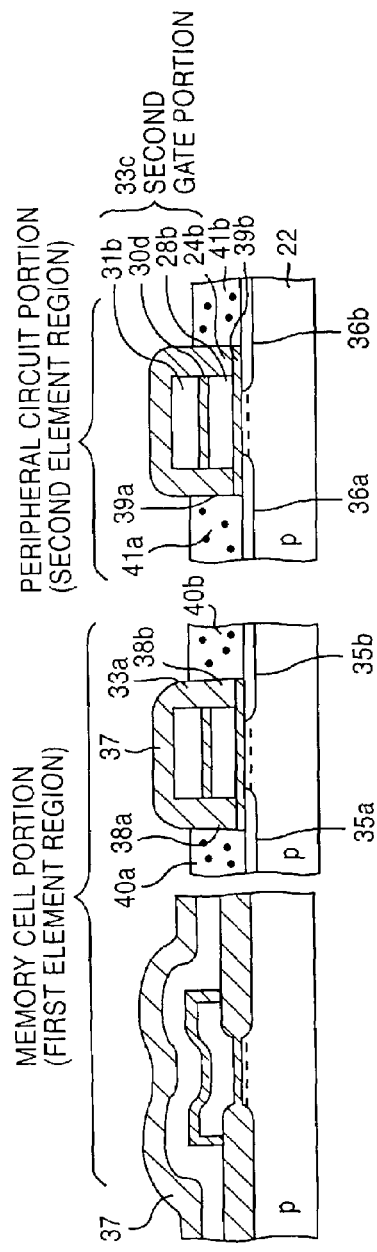
FIGS. 9(a), (b), and (c) show plan views from an upper view point for illustrating a method for preparing an EEPROM as one of the applications of the present invention.
Figure 9B:
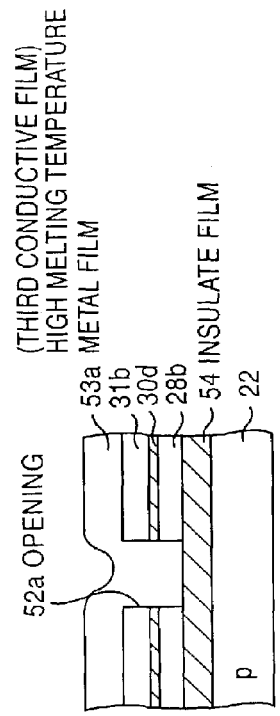
Figure 9C:
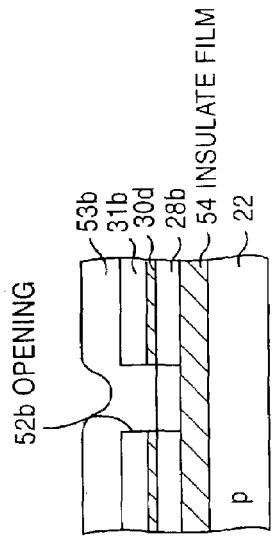

(3) Third Application of the Present Invention: A Method for Preparing a Flash Memory FIGS. 9(a) to (c) show cross-sectional views of the third application example of the present invention for illustrating a method for preparing a flash type EEPROM referred to as "FLOTOX Type" or "ETOX Type". The left figures show cross-sectional views of a memory cell portion shown in the direction of "X" (gate length), where a MOS transistor is formed having a floating gate electrode. The central figures show cross-sectional views of the memory cell portion in the left figures, shown in the direction of "Y" (that is the gate width direction perpendicular to the "X" direction). The right figures show cross-sectional views of a MOS transistor in a peripheral circuit portion.

The points of the third application example, which are different from those of the first application example, are as follows. The second gate portion 33c in the peripheral circuit portion (the second element region) has a construction of the first polysilicon film (first conductive film) 28b, the $SiO_2$ film (capacitor insulation film) 30d, and the second polysilicon film (second conductive film) 31b, whose construction is similar to the first gate portion 33a in the memory cell portion (first element region). By the steps shown in FIG. 9(b) or FIG. 9(c), the first and second polysilicon films 28b, 31b are short circuited to obtain the gate electrode.

In other words, an opening portion 52a, as shown in FIG. 9(b), is formed to penetrate the second polysilicon film 31b as the upper layer, the SiO₂ film 30d, and the first polysilicon film 28b as the lower layer. The opening portion 52a is formed on a portion other than the portion to form the second gate portion 33c as shown in FIG. 9(a), and for example, the opening portion 52a is formed on an insulation film 54. Inside opening portion 52a, a third conductive film, such as a high melting temperature metal film of W film or Ti film, is buried, so as to generate a short circuit between the first and second polysilicon films 28b, 31b.

Alternatively, an opening portion 52a, as shown in FIG. 9(c), is formed to penetrate the second polysilicon film 31b as the upper layer, and the SiO₂ film 30d. On the bottom surface of the opening 52a, the first polysilicon film 28b as the lower layer is revealed. Thereafter, inside the opening portion 52a, a third conductive film, such as a high melting temperature metal film of W film or Ti film, is buried, so as to generate a short circuit between the first and second polysilicon films 28b, 31b.

According to the third application example of the present invention, the second gate portion 33c in the peripheral circuit portion has the same construction as the first gate portion 33a in the memory cell portion. Thus, the memory cell portion and the peripheral circuit portion may be formed concurrently, resulting in simplifying the manufacturing steps.

In addition, in the third application example described here, the third conductive film 53a or 53b is formed in a step different from the step for forming the fourth conductive film described in the second application example. However, they may be formed concurrently if they are made of the common high melting temperature metal film.

(4) The Fourth Application Example of the Present Invention: A Method for Preparing a Magnetic Head The fourth application example of the present invention relates to a method for preparing a magnetic head, that is one of applications of the resist pattern-improving material having reduced edge roughness. In the fourth application example, the resist pattern-improving material according to the present invention is applied to the resist pattern 302, 326 formed from a positive type resist.

FIGS. 10(A) to (D) show process views stepwise illustrating the method for preparing a magnetic head.

Figure 10A:
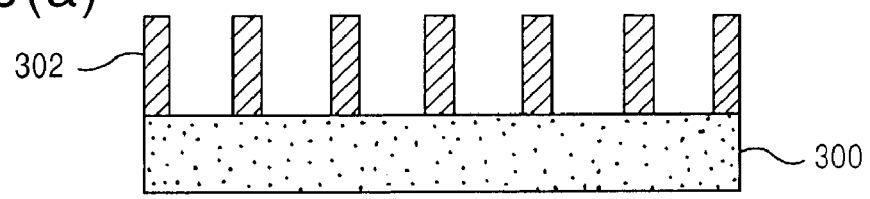
FIGS. 10(a), (b), (c), and (d) generally show cross-sectional views for illustrating a method for preparing a magnetic head by using a resist pattern formed by the positive type resist composition according to the present invention, as an example.

First of all, a resist film having a thickness of 6 μm, as shown in FIG. 10(A), is formed on a layer insulation layer 300, followed by being irradiated and developed to form a resist pattern 302 having an opeing pattern which will be used for forming a thin film magnetic coil in a shape of spiral.

Figure 10B:
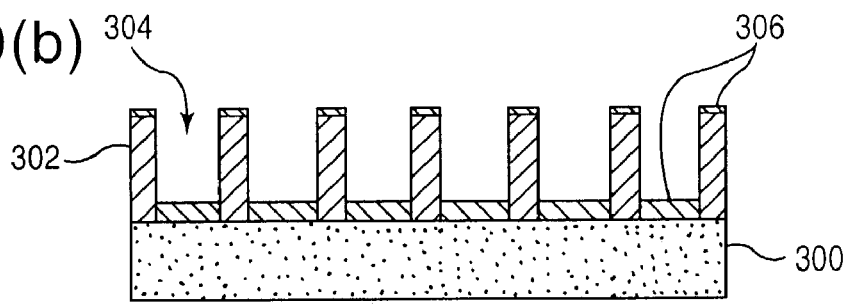

Then, as shown in FIG. 10(B), a plating surface preparation layer 306 is formed either on a portions with the resist pattern 302 and a portion without the resist pattern (the opening portion 304), on the layer insulation layer 300. The plating surface preparation layer 306 is composed of a Ti layer having a thickness of 0.01 μm and a Cu layer having a thickness of 0.05 μm, which are formed by means of deposition.

Figure 10C:
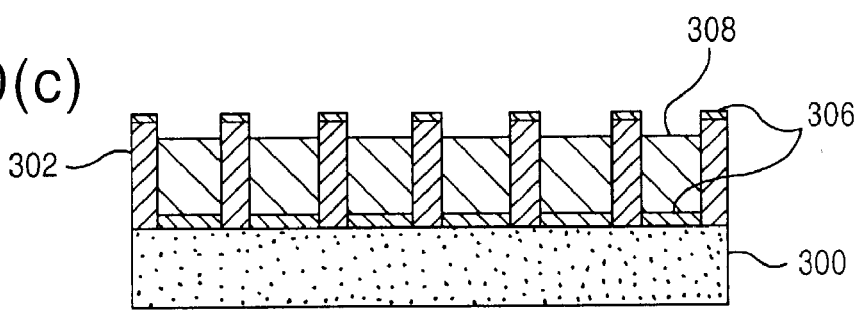

Then, as shown in FIG. 10(C), a thin film conductor 308 is formed on a portion without forming the resist pattern 302, where the plating surface preparation layer 306 is formed on the opening portion 304. The thin film conductor 308 is made of a Cu plating film having a thickness of 3 μm.

Figure 10D:
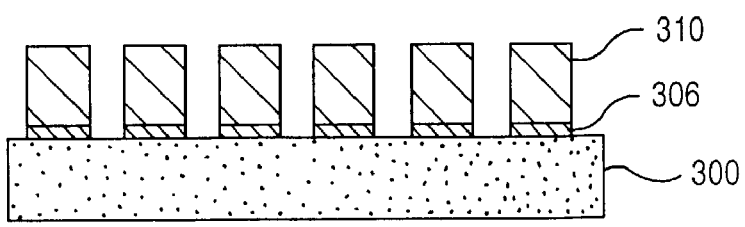

Then, as shown in FIG. 10(D), the resist pattern 302 is removed or lifted off by means of dissolution from the layer insulation layer 300, to obtain a thin film magnetic coil 310 made of a thin film conductor 308 having a spiral pattern.

As described above, the magnetic head is prepared.

Thereby obtained magnetic head is prepared by using the resist pattern 302 as a mask whose edge roughness is reduced by the resist pattern-improving material according to the present invention, and therefore, it has a spiral shape having reduced edge roughness. The thin film magnetic coil 310 has a very small pattern, but it is made finely, and in addition, it is superior in mass production.

FIGS. 11 to 16 shows process views for illustrating various magnetic heads.

Figure 11:
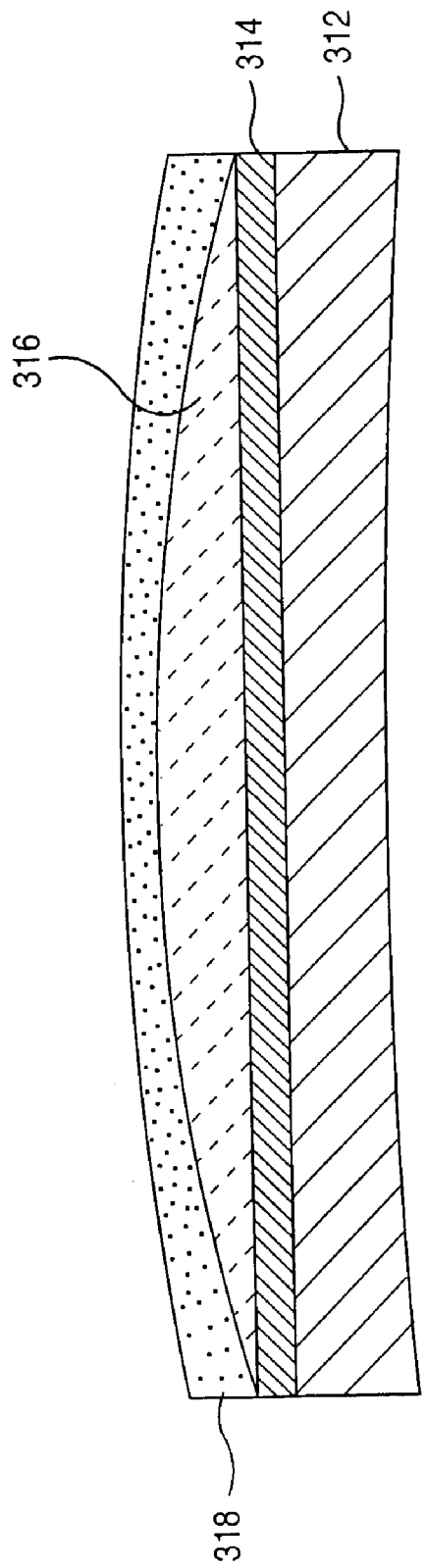
FIG. 11 generally shows a (first) cross-sectional view for illustrating a method for preparing a magnetic head by using a resist pattern formed by the positive type resist composition according to the present invention, as an example.

As shown in FIG. 11, a gap layer 314 is coated and formed on a non-magnetic base board of a ceramics by means of spattering. On the non-magnetic base board 312, an insulating layer of silicon oxide and an insulating surface preparation layer of Ni—Fe permalloy are previously coated and formed by means of spattering, which are not shown in the figures. Moreover, a magnetic layer of Ni—Fe permalloy as a lower layer is previously formed. A resin insulating film 316 of a heat curable resin is formed on a predetermined portion of the gap layer 314 other than the portion to be a magnetic tip portion of the magnetic layer as the lower layer, not shown in the figures. Then, a positive type resist composition is coated on the resin insulating film 316 to form a resist film 318.

Figure 12:
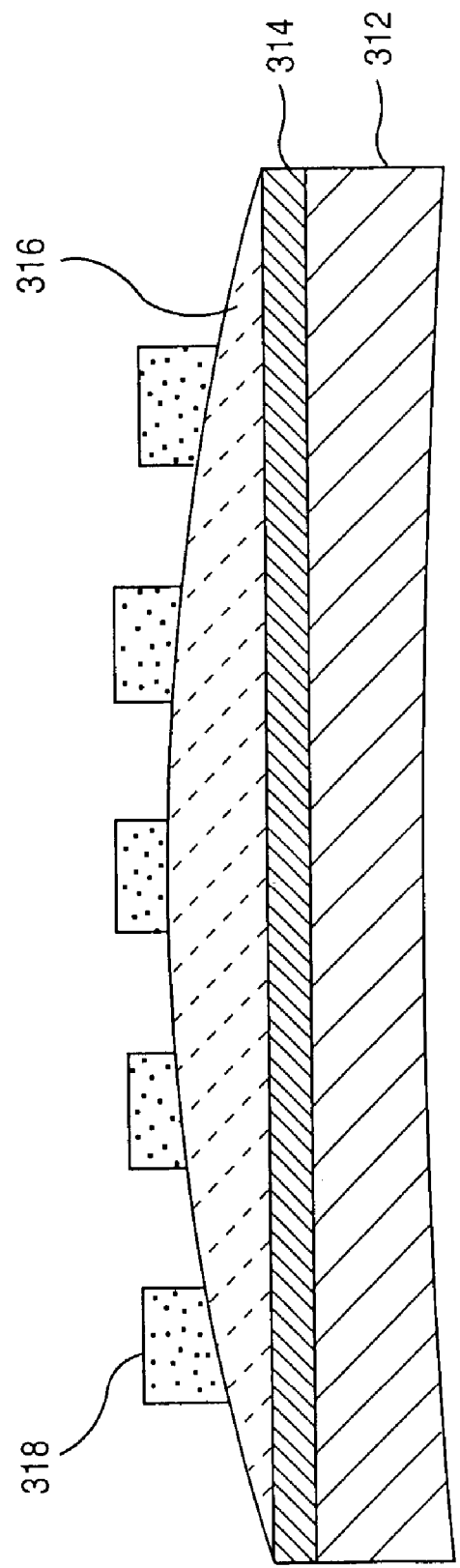
FIG. 12 generally shows a (second) cross-sectional view for illustrating a method for preparing a magnetic head by using a resist pattern formed by the positive type resist composition according to the present invention, as an example.
Figure 13:
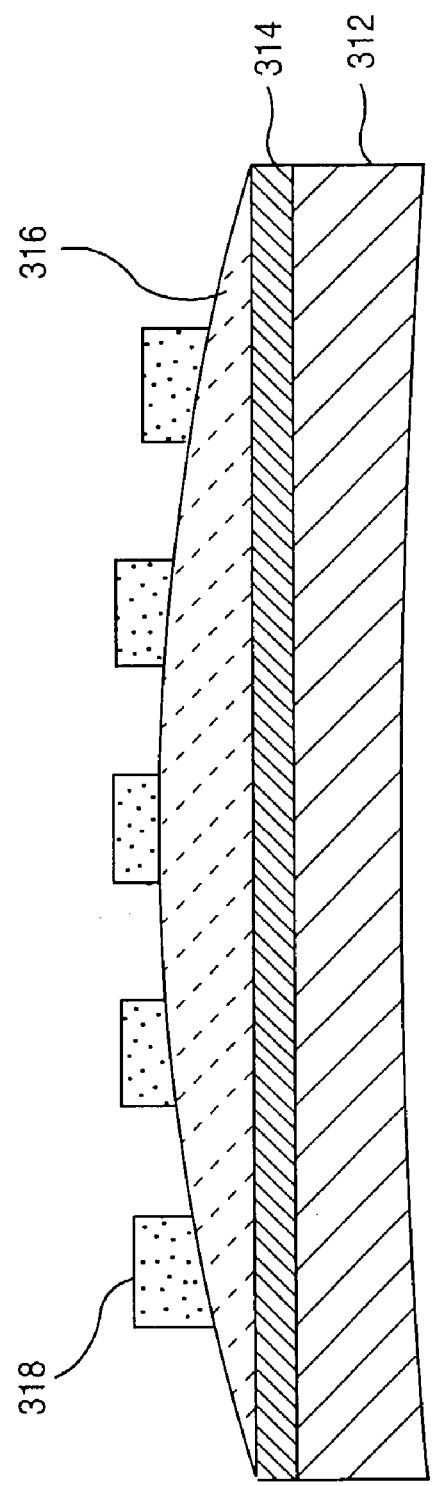
FIG. 13 generally shows a (third) cross-sectional view for illustrating a method for preparing a magnetic head by using a resist pattern formed by the positive type resist composition according to the present invention, as an example.

Then, the resist film 318 is irradiated and developed to form a spiral pattern as shown in FIG. 12 Thereafter, the resist film having a spiral shape is subjected to a heat curing treatment at a temperature of a couple of hundreds degree in Celsius for a period of 1 hour, so as to form a first spiral shaped pattern 320 having protrusions. On the surface, a conductive surface preparation layer 322 of Cu is further formed.

Figure 14:
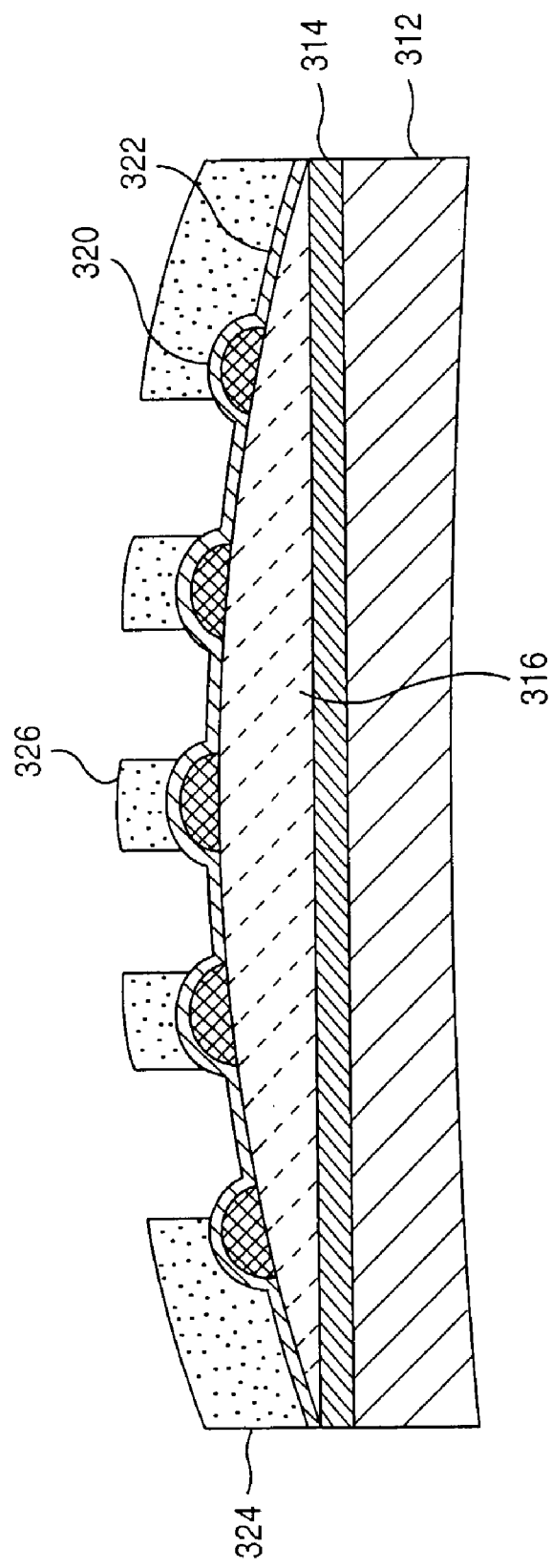
FIG. 14 generally shows a (fourth) cross-sectional view for illustrating a method for preparing a magnetic head by using a resist pattern formed by the positive type resist composition according to the present invention, as an example.

Then, as shown in FIG. 14, a positive type resist composition is spin-coated on the conductive surface preparation layer 322 so as to form a resist film 324 Thereafter, the resist film 324 is patterned on the first spiral shaped pattern 320, so as to obtain a resist pattern 326.

Figure 15:
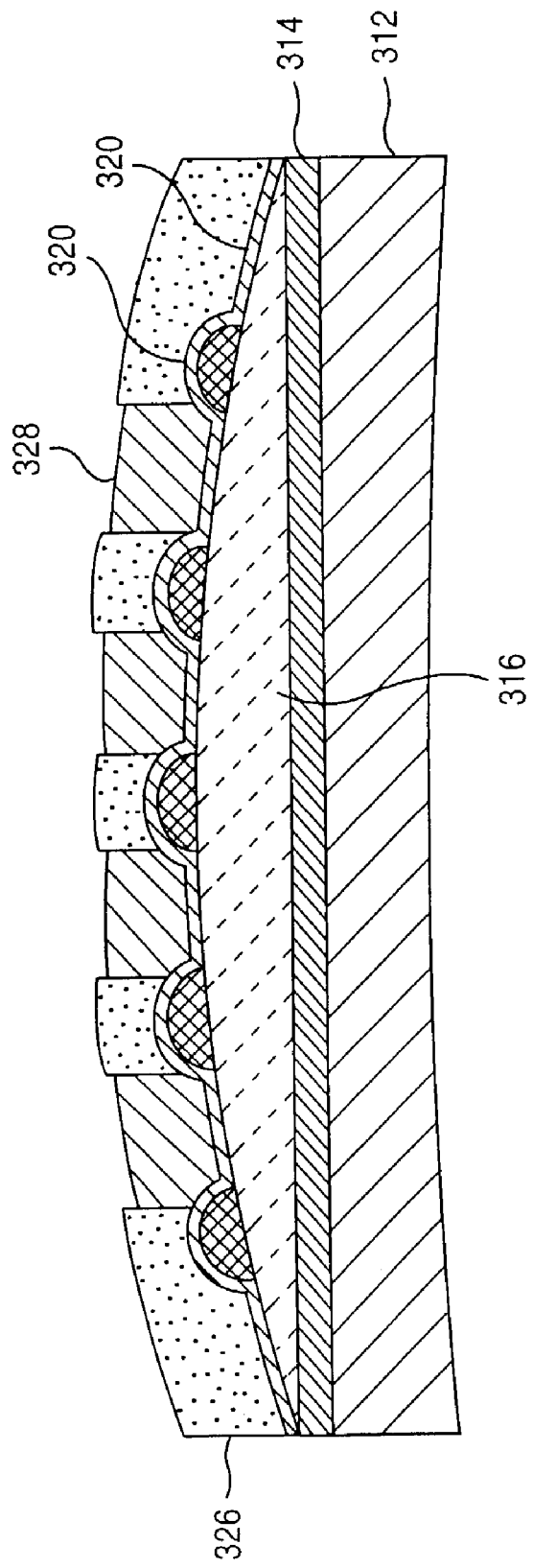
FIG. 15 generally shows a (fifth) cross-sectional view for illustrating a method for preparing a magnetic head by using a resist pattern formed by the positive type resist composition according to the present invention, as an example.
Figure 16:
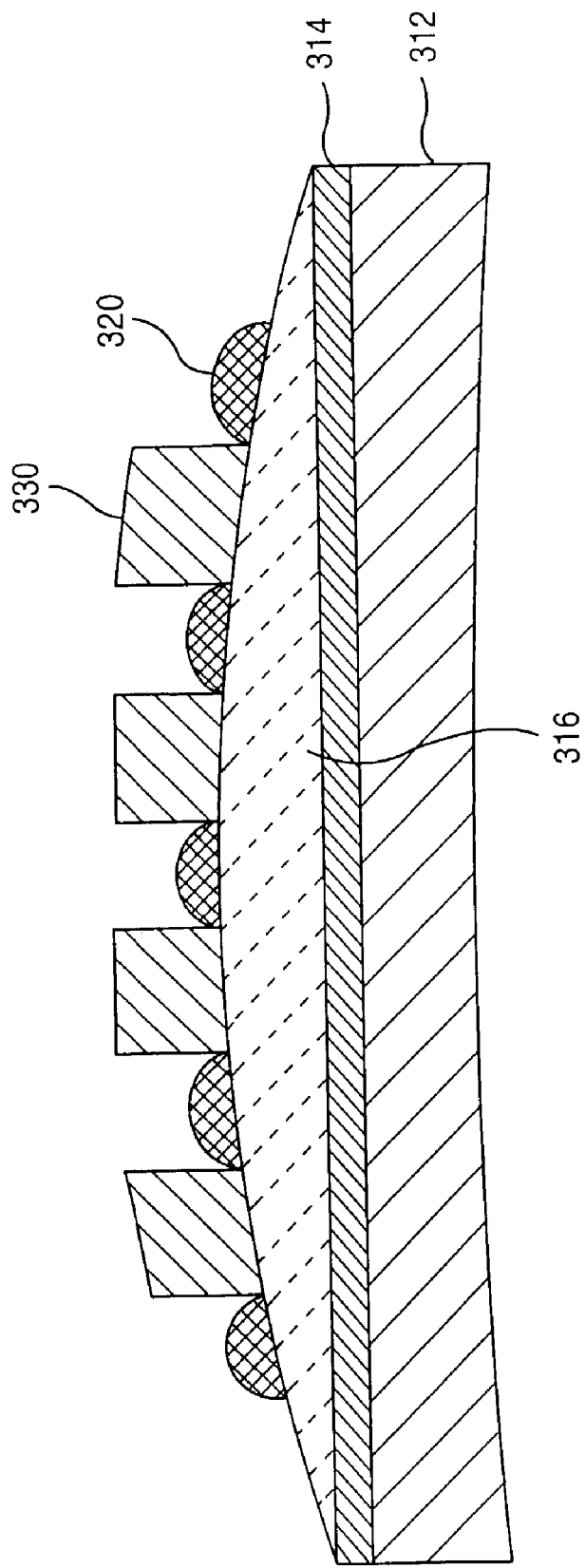
FIG. 16 generally shows a (sixth) cross-sectional view for illustrating a method for preparing a magnetic head by using a resist pattern formed by the positive type resist composition according to the present invention, as an example.

Then, as shown in FIG. 15, a Cu conductive layer 328 is formed, by means of plating, on the revealed surface of the conductive surface preparation layer 322, that is a portion where the resist pattern 326 is not formed. Thereafter, as shown in FIG. 16, the resist pattern 326 is removed or lifted off, by means of dissolution, from the conductive surface preparation layer 322 to obtain a thin magnetic coil 330 of the Cu conductive layer 328 having a spiral shape.

Figure 17:
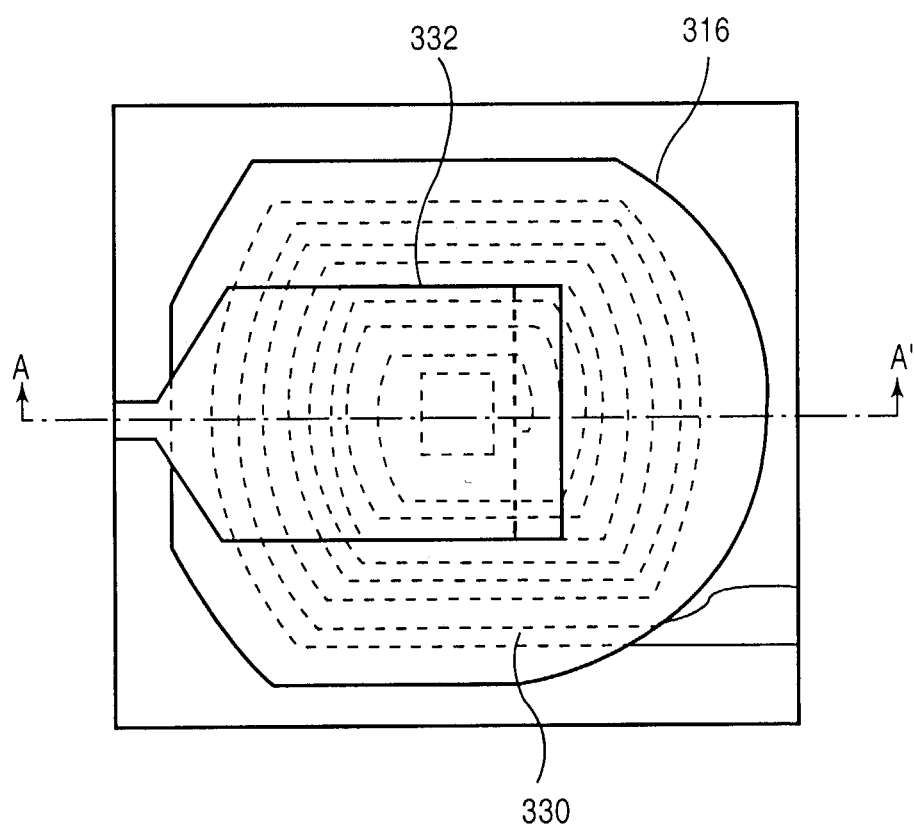
FIG. 17 shows a plan view of a magnetic head prepared in accordance with the steps shown in FIG. 11 to FIG. 16.

As described above, there is prepared a magnetic head having a writable magnetic pole 332 of the magnetic layer formed on a resin insulating layer 316, and a thin film magnetic coil 330 on its surface, as shown in a plan view of FIG. 17. The pattern of the writable magnetic pole 332 of the magnetic layer is formed in a manner that a positive type resist is located as the upper layer, and a novolac type resist is located as the lower layer. Such an upper layer pattern formed by irradiation and development is vertically transferred on the lower layer by means of an enzyme plasma. Then, a plating film is formed followed by removing the resist and etching the plated base Since thereby obtained magnetic head is formed by using a resist pattern 326 whose edge roughness is reduced by the resist pattern-improving material according to the present invention. The spiral pattern of the magnetic head is very small but formed finely. The tip portion of the writable magnetic pole 332, composed of the thin film magnetic coil 330 and the magnetic layer, has a very small and fine size and a high aspect ratio, and also is superior in mass production.

Figure 19A:
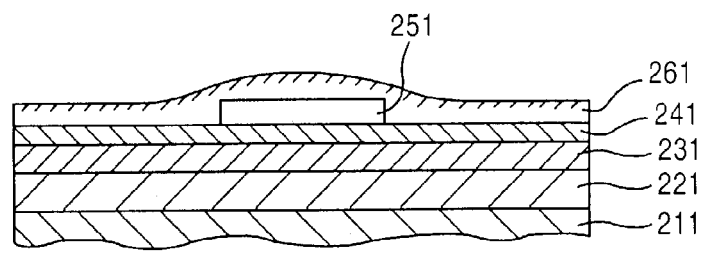
FIG. 19 generally shows (first) process for preparing the MR element portion shown in FIG. 18.
Figure 19B:
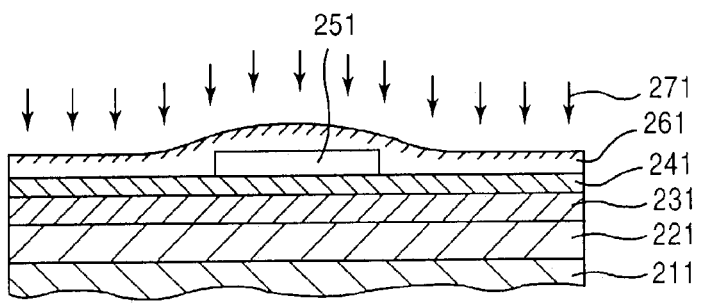
Figure 19C:
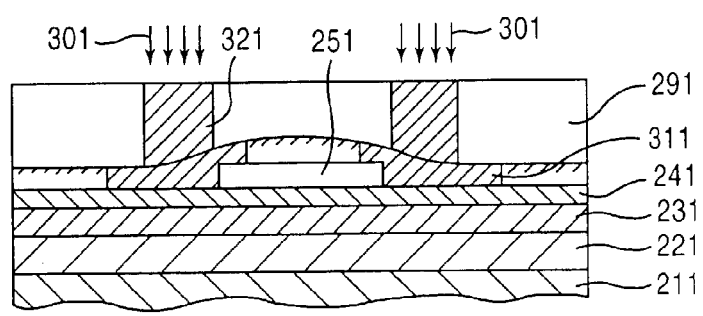

An MR element portion 11 is formed to be provided with a terminal 12 of a magnetic head (MR type head) as shown in FIG. 18, as follows. As shown in FIG. 19(a), an alumina layer 221 is provided on a supporting material 211, on which a lower shield layer 231 of NiFe and a lower gap layer 241 of alumina are continuously formed. Further, on the lower gap layer 241, a first resist layer 261 is formed above the surface of the base board having an MR pattern 251. Then, the base board having the first resist layer 261 formed is subjected to irradiation of a monochromatic light 271 on the whole surface thereof to improve its surface, as shown in FIG. 19(c). This step is intended to prevent the surface layer from mixing with the second resist layer formed thereon. On the first resist layer 261 whose surface is improved, a second resist layer 29 is formed, as shown in FIG. 19(c). Thereafter, using a photomask having a predetermined pattern, an i ray is selectively irradiated. In FIG. 19(c), the irradiated portions 311, 321 are remained. After the irradiation, baking is performed, and then, it is developed.

Figure 20D:
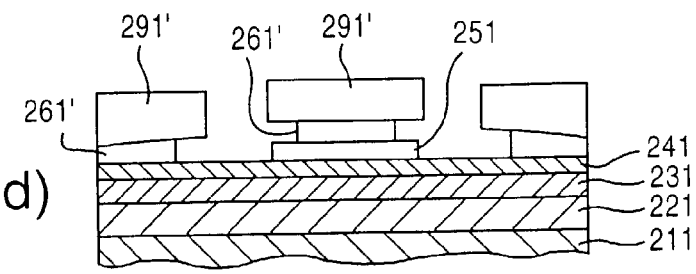
FIG. 20 generally shows a (second) process for preparing the MR element portion shown in FIG. 18.
Figure 20E:
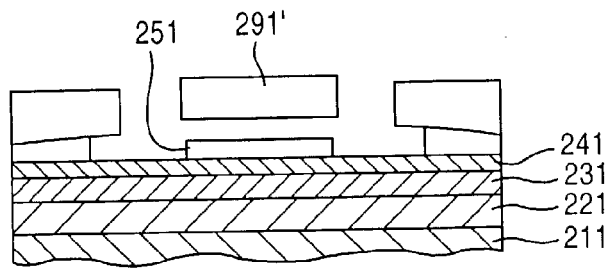
Figure 20F:
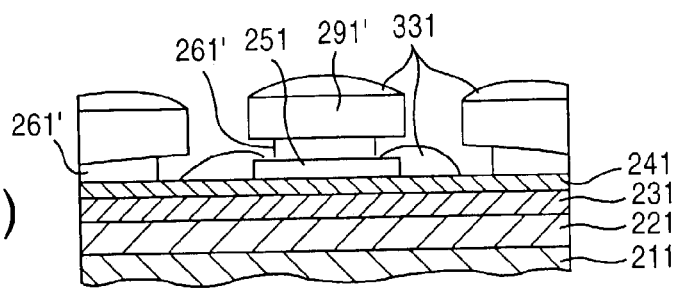
Figure 20G:
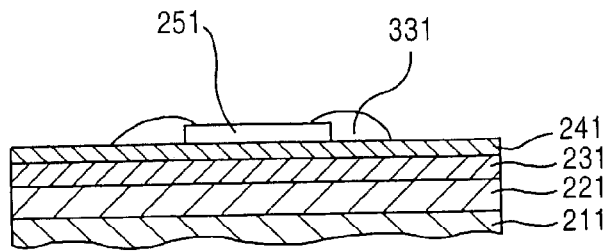

As a result, a resist pattern, whose condition is that a pattern 261' of the first resist layer 261 is eroded under the pattern 291' of the second resist layer 291, is formed, as shown in FIG. 20(d). As shown in FIG. 20(e), the lower portion of the resist pattern on the MR element 251 may be formed into a hollow. Thereafter, a terminal forming material 331 is formed into a film on the surface of the base board having the two layer resist pattern, as shown in FIG. 20(f). Then, the two layer resist pattern is dissolved and selectively removed in a solution for development, so as to form a pattern of the terminal forming material 331 at a portion where the two layer resist pattern is not provided. Here, the MR pattern 251 corresponds to the MR element portion 11 shown in FIG. 18, and the pattern of the terminal forming material 331 corresponds to the terminal 12 shown in FIG. 18.

Figure 21A:
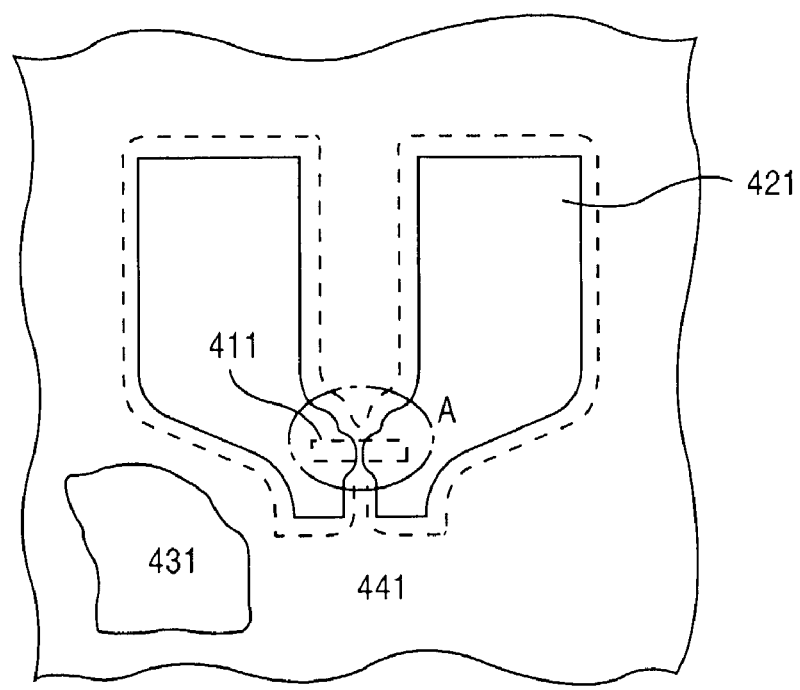
FIG. 21 shows a plan view of a situation where a terminal connected to an MR element is formed from two layers of a first resist layer and a second resist layer.
Figure 21B:
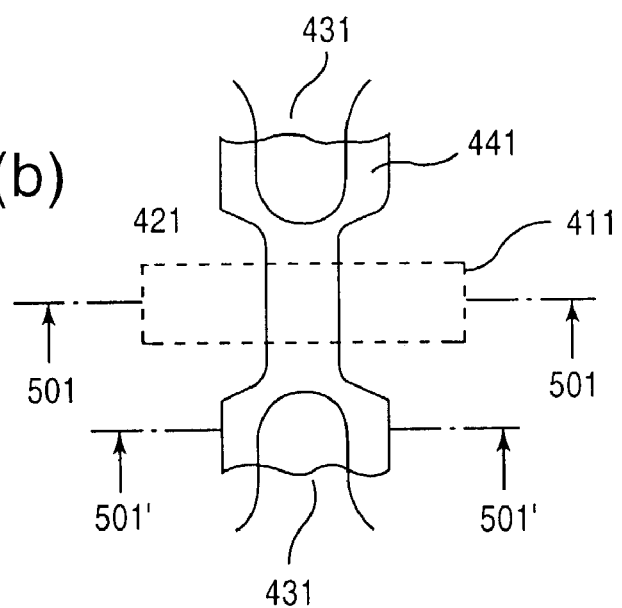
Figure 22A:
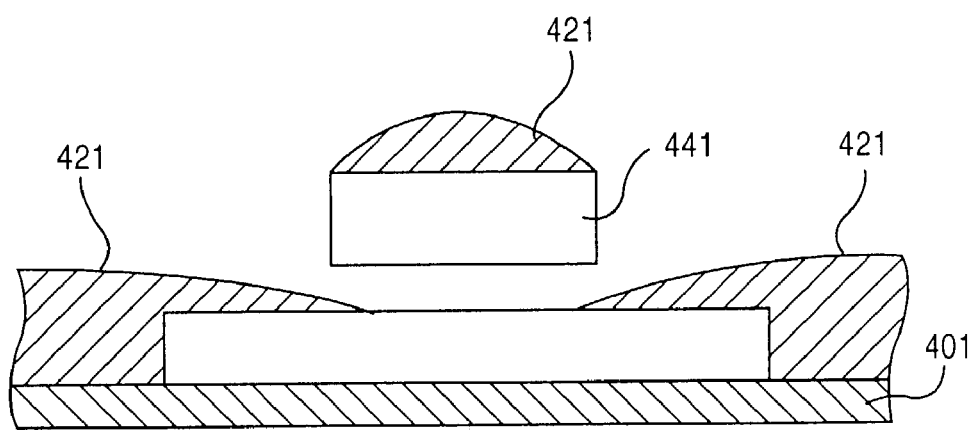
FIG. 22 shows cross-sectional views at lines of 50-50 and 50'-50' in FIG. 21.
Figure 22B:
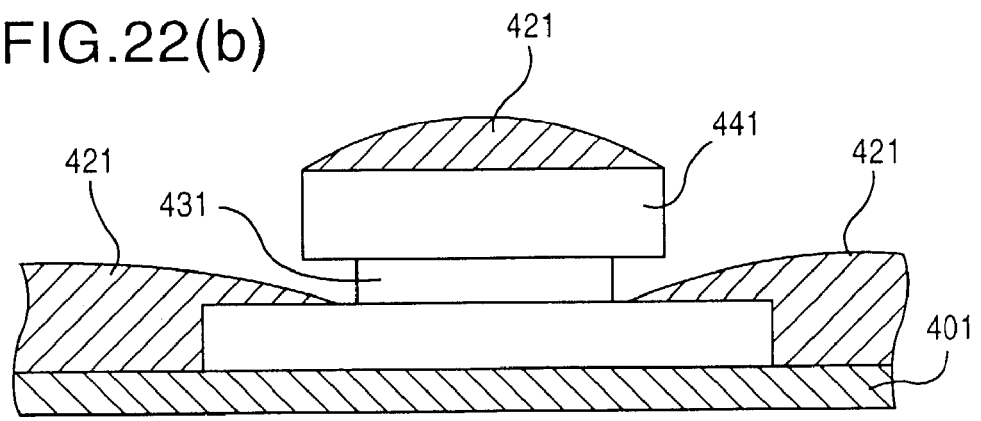
Figure 23A:
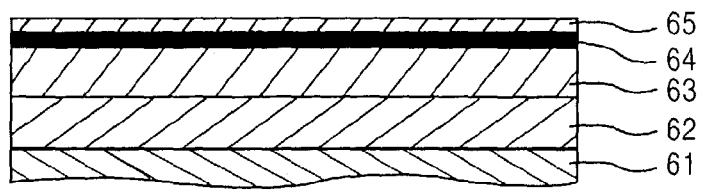
FIG. 23 shows process views for forming an MR element which is used for a magnetic head (MR head) by means of lifting off process.
Figure 23B:
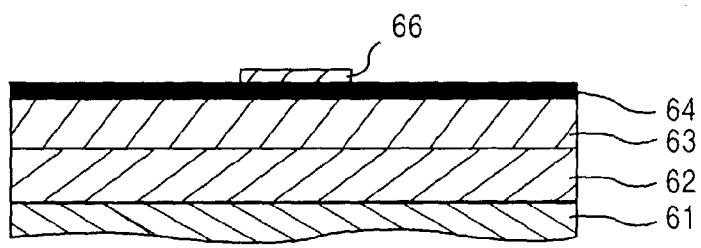
Figure 23C:
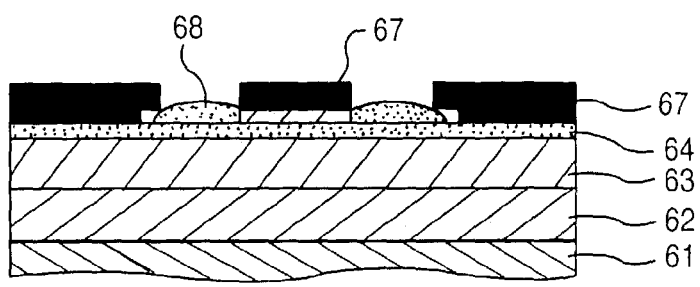
Figure 23D:
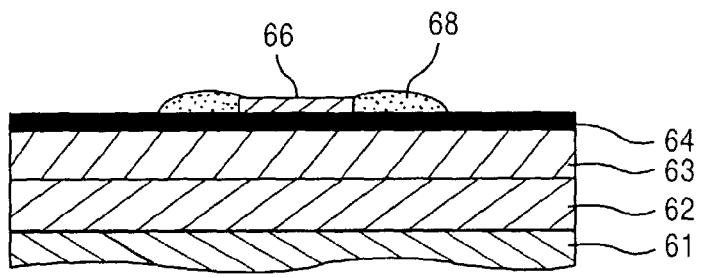
Figure 23E:
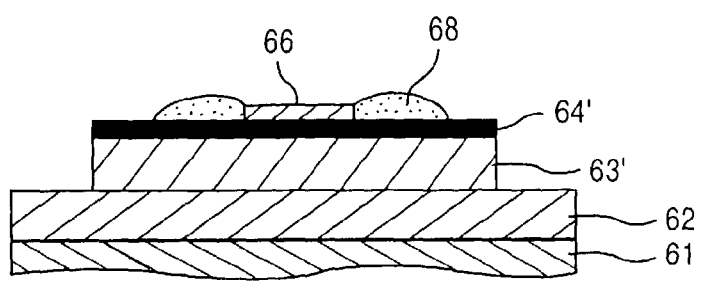
Figure 24A:
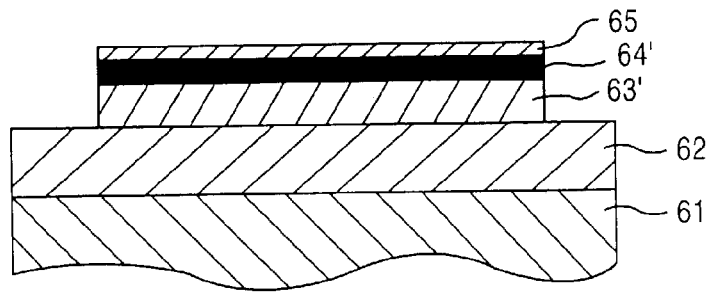
FIG. 24 shows process views for forming an MR element which is used for a magnetic head (MR head) by means of lifting off process.
Figure 24B:
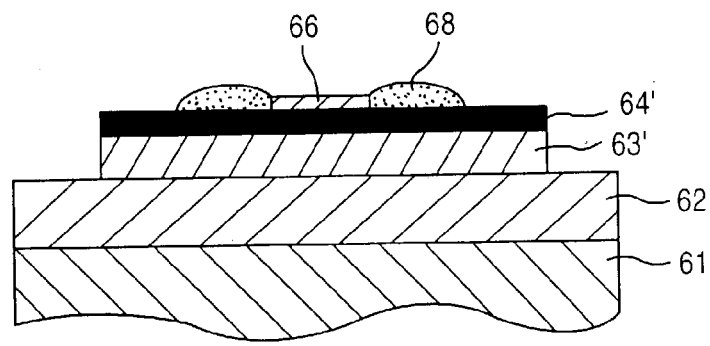
Figure 24C:
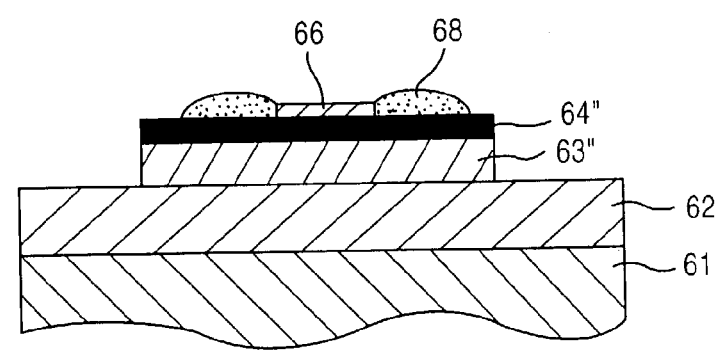
Figure 25A:
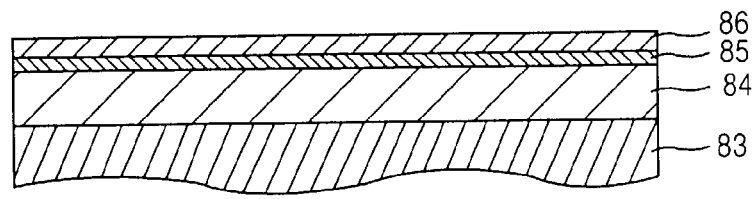
FIG. 25 shows (first) process views for forming an MR element which is used for a magnetic head (MR head), by means of milling process.
Figure 25B:
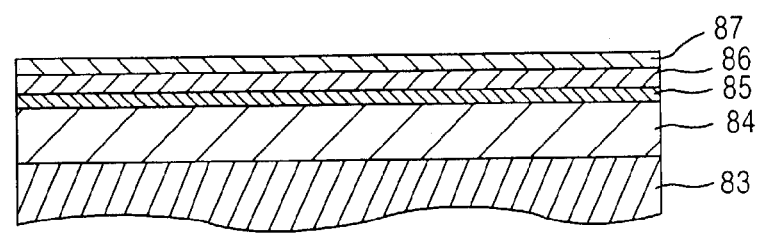
Figure 25C:
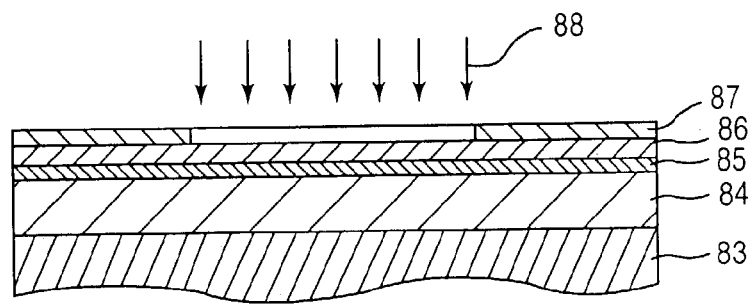
Figure 25D:
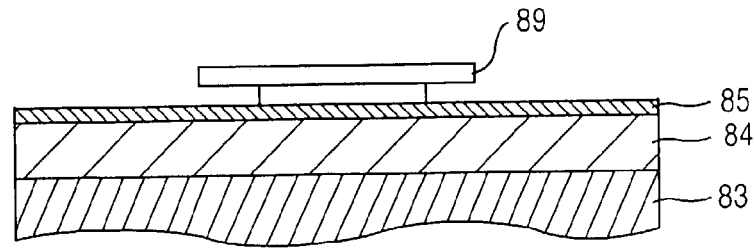

Then, see FIG. 21 and FIG. 22. Explanation here is focused on a process of a hollow lifting off. FIG. 21 shows a plan view of a situation where a terminal 421 connected to an MR element 411 is formed by using two layers of the first resist layer 431 and the second resist layer 441. The first resist layer 431 is eroded under the second resist layer 441, whose periphery is drawn by a dashed line. The lower figure in FIG. 21 shows a magnified view of the MR element 411, which corresponds to the portion pointed out by a symbol "A" in the upper figure in FIG. 21. In the lower figure of FIG. 21, the periphery of the first resist layer 431 under the second resist layer 441 is shown by a dashed line. Above the MR element 411, only the second resist layer 441 exists, between which there is a hollow. As shown by a cross-sectional view of FIG. 22, the upper figure in FIG. 22 shows a cross-sectional view at a line 50-50 pointed out in the lower figure of FIG. 21, which illustrates a hollow structure between the MR element 411 and the second resist layer 441. The lower figure in FIG. 22 shows a cross-sectional view at a line 50'-50' pointed out in the lower figure in FIG. 21, which illustrates the second resist layer 441 formed on the first resist layer 431 provided on the base board 401. As shown in the upper figure in FIG. 22 and the lower figure in FIG. 22, a film 421 of the terminal forming material on the second resist layer 441 will be removed or lifted off together with the two layers of the first resist layer 431 and the second resist layer 441, when a lifting off treatment is performed For example, there is provided a method for preparing an MR element for a magnetic head (MR head) by means of the lifting off process. As shown in FIG. 23(a), an alumina layer 62 is provided on a supporting material 61, on which a lower shield layer 63 of NiFe and a lower gap layer 64 of alumina are continuously formed, so as to prepare a base board having an MR film 65 on the lower gap layer 64 for producing an MR element. Then, the MR film 65 on the surface of the base board is patterned to prepare an MR element 66 as shown in FIG. 23(b). Continuously, as shown in FIG. 23(c), a terminal 68 is formed on the lower gap layer 64 on the base board, by using a mask pattern 67. Then, the mask pattern 67 is removed by means of the lifting off process, as shown in FIG. 23(d). Thereafter, as shown in FIG. 23(e), the lower shield layer 63 and the lower gap layer 64 are patterned by means of ion trimming, so as to obtain the lower shield layer 63' and the lower gap layer 64'. Alternatively, the lower shield layer 63' and the lower gap layer 64' may be formed by patterning on the base board as shown in FIG. 24(a), and then, the MR element 66 may be formed and the terminal 68 may be formed by means of lifting off as shown in FIG. 24(b), and then the lower shield layer 63' and the lower gap layer 64' may be patterned as shown in FIG. 24(c), and thereby, the final shape of the lower shield layer 63 and the lower gap layer 64 may be obtained.

Figure 26E:
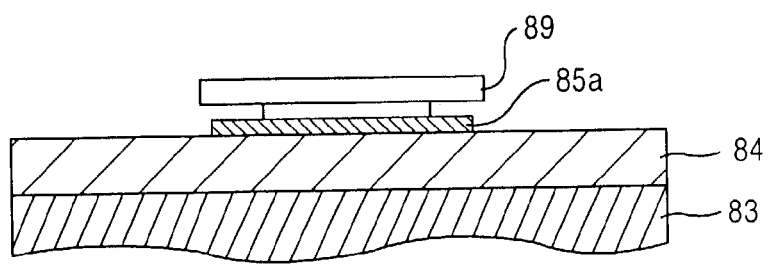
FIG. 26 shows (second) process views for forming an MR element which is used for a magnetic head (MR head), by means of milling process.
Figure 26F:
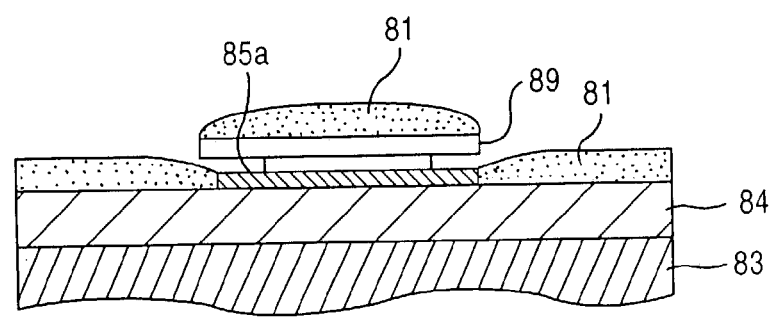
Figure 26G:
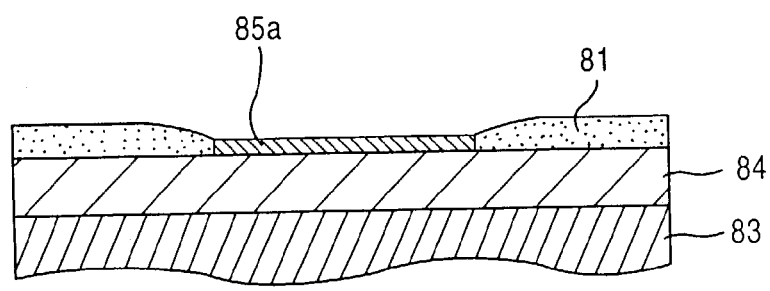
Figure 27A:
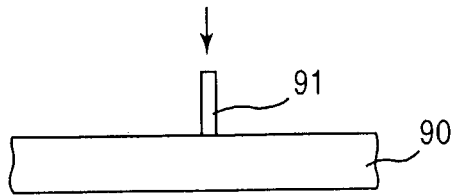
FIG. 27 shows process views for preparing a T-gate electrode of an HHMT.
Figure 27B:
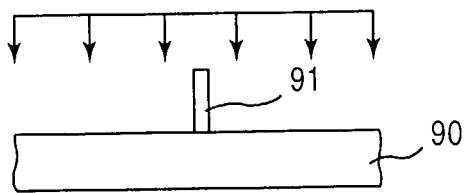
Figure 27C:
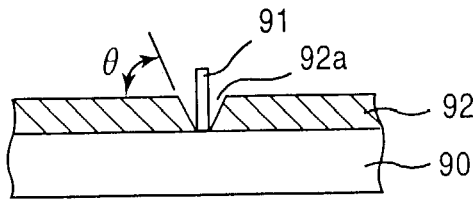
Figure 27D:
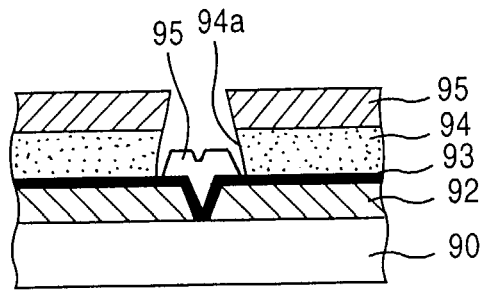
Figure 27E:
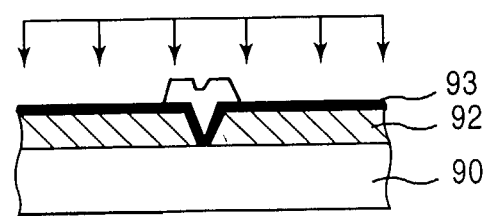
Figure 27F:
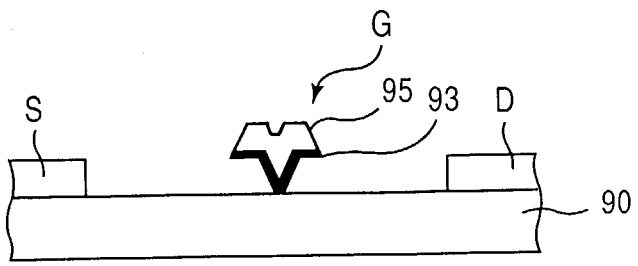
Figure 28A:
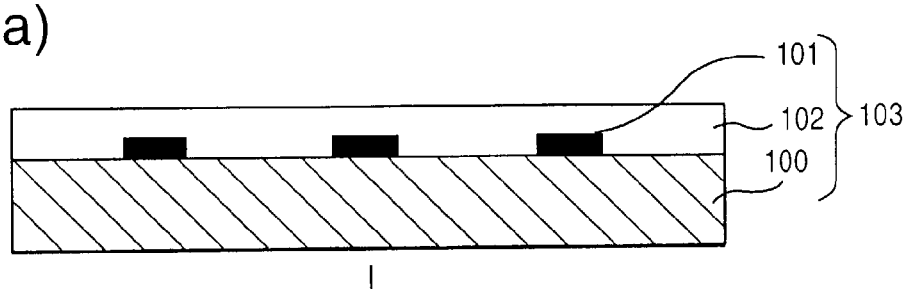
FIG. 28 shows (first) process views for preparing a partition wall for a plasma display panel.
Figure 28B:
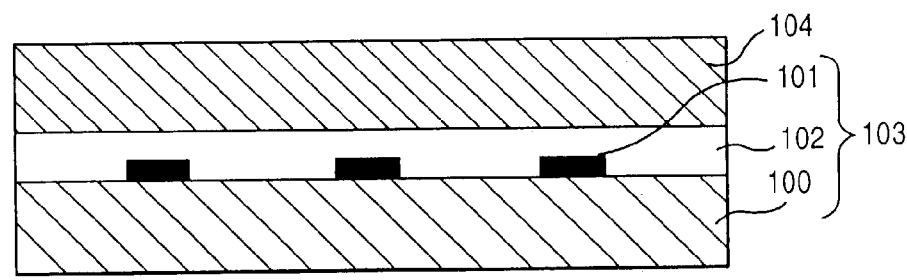
Figure 28C:
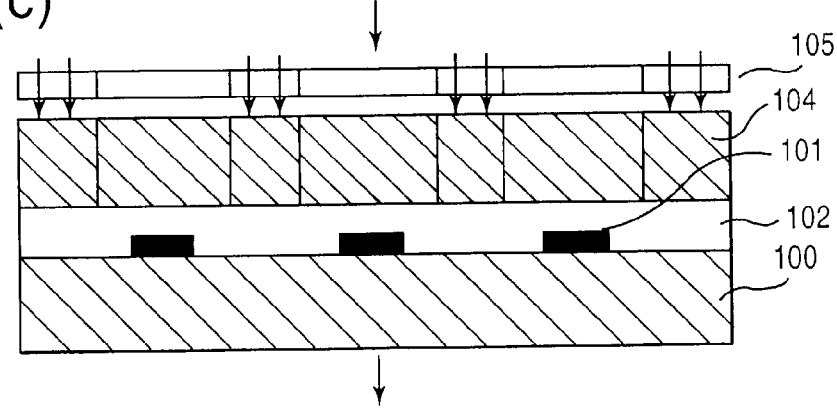
Figure 28D:
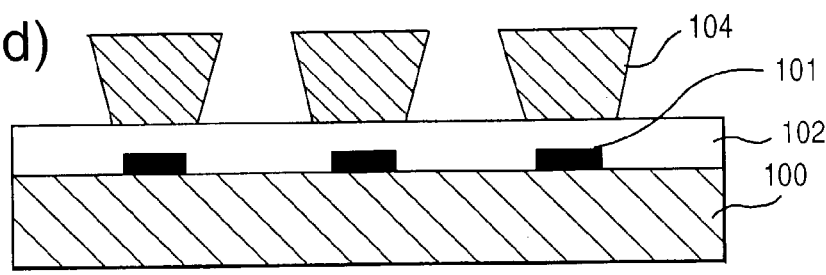

Then, there is provided another method for preparing a magnetic head, with reference to FIG. 25 and FIG. 26. As shown in FIG. 25(a), a base board is prepared which has a lower shield layer 83 of NiFe, a lower gap layer 84 of alumina, and an MR film 85 for an ER element continuously formed on an alumina layer (not shown) provided on a supporting material (not shown) On the base board, polymethyl glutalimide made by Japan Macdermid Corporation as a material for the first resist layer is spin-coated to have a thickness of 0.3 µm, followed by baking at a temperature of 180° C. for a period of 2 minutes, so as to form a first resist layer 86. Then, the base board is placed on a hot plate inside a chamber for surface treatment, followed by irradiating a light ($Xe_2$ excimer light) having a wavelength of 172 nm on the whole surface of the base board at an irradiation length of 1 mm for a period of 20 seconds. Then, the base board is moved into a coating cup again, and then, the positive type resist composition according to the present invention is spin-coated thereon to have a thickness of 2.0 nm, followed by baking at a temperature of 110° C. for a period of 2 minutes, so as to form a second resist layer 87. Continuously, as shown in FIG. 25(c), an i ray 88 is irradiated through a predetermined mask pattern formed by a g ray spattering. After the irradiation, it is developed by a solution of tetramethyl ammonium hydroxide at a concentration of 2.38% by mass. At the time of development, the first resist layer 86 and the second resist layer 87 are concurrently developed so as to form two layer resist pattern 89 as shown in FIG. 25(d). Observation of the structure of the two layer resist pattern 89 by an optical microscope shows that the lower layer is eroded under the upper layer. Then, as shown in FIG. 26(e), the two layer resist pattern 89 is masked to pattern by means of ion milling to form an MR element 85a, followed by that a metal film 81 to be a terminal is formed by means of spattering as shown in FIG. 26(f). Then, the two layer resist pattern 89 is removed by a resist removing agent (MS-2001 made by Fuji Hunt Corporation), followed by washing with ethanol and drying to form a terminal 81.

(5) The Fifth Application Example of the Present Invention: A Method for Preparing an HEMT There is provided a method for preparing an HEMT as an example of the applications for the resist pattern-improving material according to the present invention. In this application example, a resist patterns formed from a positive type resist 91, 94 are formed by using the resist pattern-improving material according to the present invention for reducing the edge roughness.

FIG. 27 shows process views illustrating a method for preparing a T-gate electrode of an HEMT. As shown in FIG. 27(a), there is prepared a GaAs base board 90 having a buffer epitaxial layer, an epitaxial layer for supplying second electrons, and a cap epitaxial layer formed thereon. On the GaAs base board 90, a negative type first electron beam resist (SAL-601 made by Shipley Corporation) is coated, followed by baking. Thereafter, an electron beam is irradiated to form a resist pattern 91 having a separated line shape. The resist pattern 91 has a gate length of 0.1 μm and a thickness of 1 μm. After the irradiation, the negative type first electron beam resist is developed, followed by washing and drying to obtain a resist pattern 91 having a separated line shape, the resist pattern 91 having a gate length of 0.1 μm and a thickness of 1 μm. Then, as shown in FIG. 27(b), the base board is treated by an enzyme plasma (for example, at an electric power of 100 W, at a period of 30 seconds, at an oxygen flow rate of 200 sccm) in order to improve its wettability Then, as shown in FIG. 27(c), an OCD (made by Tokyo Ohka Kogyo Co, Ltd.), that is an insulate spin-on-glass (SOG) is coated on the GaAs base board 90 at a thickness of 0.5 μm, followed by baking at a temperature of 110° C. for a period of 2 hours. Thus, an insulation film 92 is formed. Thereafter, an $O_2$-Assher is used for removing the resist pattern 91 having a separated line shape, so as to form an opening 92a whose cross-section has a taper shape (the angle of the taper: 60 degree.) Then, as shown in FIG. 27(d), TiW is coated by means of spattering to have a thickness of 0.1 μm, on the whole surface of the GaAs base board, so as to form a first metal wiring layer 93 which will be used for a lower gate electrode. On the first metal wiring layer 93, a positive type resist is coated to have a thickness of 0.6 μm, followed by baking to form a resist layer 94. Thereafter, an irradiation and development of the resist 94 are carried out followed by washing and drying, so as to form an opening 94a larger than the opening 92a, whose cross-section has an opposite-taper shape. The opening 94a has a gate length of 0.5 μm. Thereafter, Ti and Al are continuously deposited to have a thickness of 0.5 μm on the GaAs base board, so as to form a second metal wiring layer 95 which will be used for an upper gate electrode. As shown in FIG. 27(e), the portion having the second metal wiring layer 95 formed on the opening 92a is remained, and the other portion of the second metal wiring layer 95 and the resist layer 94 thereunder are removed or lifted off by using an organic solvent. Then, as shown in FIG. 27(f), the remained portion of the second metal wiring layer 95 is used as a mask. By means of RIE, the first metal wiring layer 93 formed under the second metal wiring layer 95 is remained, and an unnecessary portion of the first metal wiring layer 93 is removed, and the insulation film 92 formed thereunder is removed by using a solution of $NH_4F$, so as to form a fine T-gate electrode.

(6) The Sixth Application Example of the Present Invention: A Method for Preparing a Plasma Display There is provided a method for preparing a plasma display as an example of applications of the resist pattern-improving material according to the present invention for reducing the edge roughness. In the fifth application example described here, the resist pattern-improving material according to the present invention is applied to a positive type resist pattern 104. See FIGS. 28 and 29.

Figure 29E:
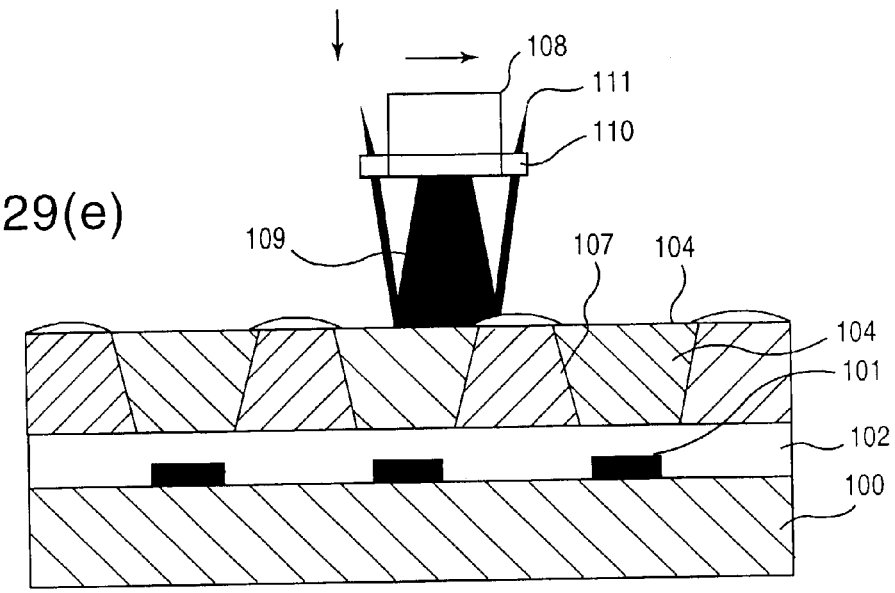
FIG. 29 shows (second) process views for preparing a partition wall for a plasma display panel.
Figure 29F:
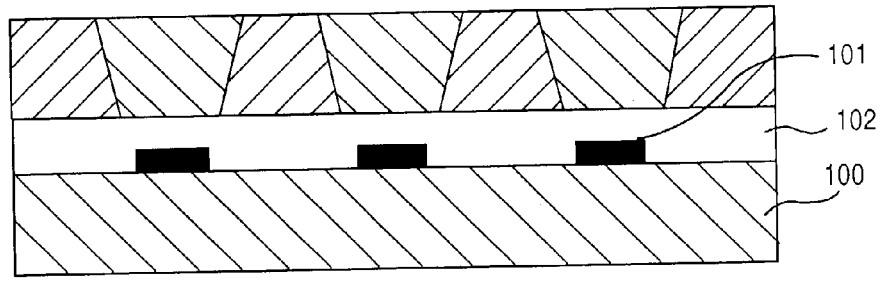
Figure 29G:
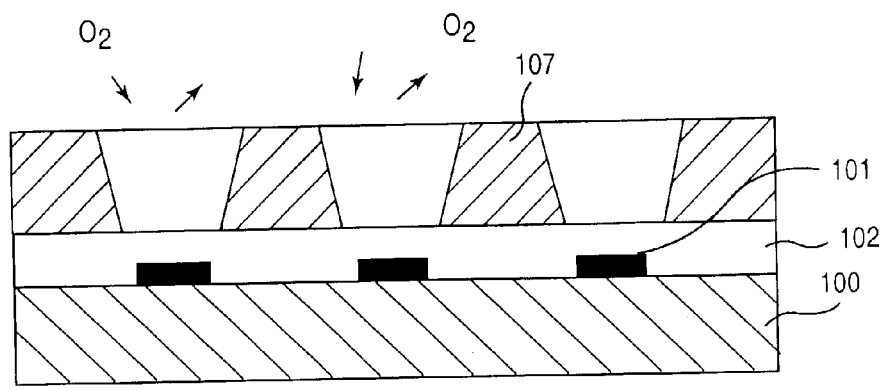

With reference to FIG. 28 and FIG. 29, a process for forming a partition wall in a plasma display is explained. FIGS. 28(a) to (d) and FIGS. 29(e) to (g) show cross-sectional views for illustrating processes for forming a partition wall. As shown in FIG. 28(a), an address electrode 101 is formed on a glass base board 100. The glass base board 100 is, for example, made of a soda glass or high strain glass having a thickness of 2.8 mm. After forming the address electrode 101, for example, a surface preparation layer 102 of dielectric glass is formed. In the following explanations, the glass base board 100, address electrode 101, and surface preparation layer 102 may be referred to as a base board 103 for convenience. Then, as shown in FIG. 28(b), a photosensitive coating layer 104 is formed on the base board 103. The photosensitive coating layer 104 is formed by using a positive type resist material, to have a thickness of 120 nm. Then, as shown in FIG. 28(c), an i ray is irradiated through a photo mask 105 having a predetermined width and pitch of the pattern. The amount of the irradiation is adjusted according to the width and pitch of the pattern of the photo mask 105. As shown in FIG. 28(d), the irradiation is followed by development. A solution of sodium carbonate at a concentrate of 1% by mass is used for the development. The development is subjected for a period of about 3 minutes, followed by washing in water. Thereafter, as shown in FIG. 29(e), a plasma welding is carried out on the base board 103, so as to deposit a welding film 107 of a partition wall material at the inside of the grooved portions of the photosensitive layer 104.

Figure 30:
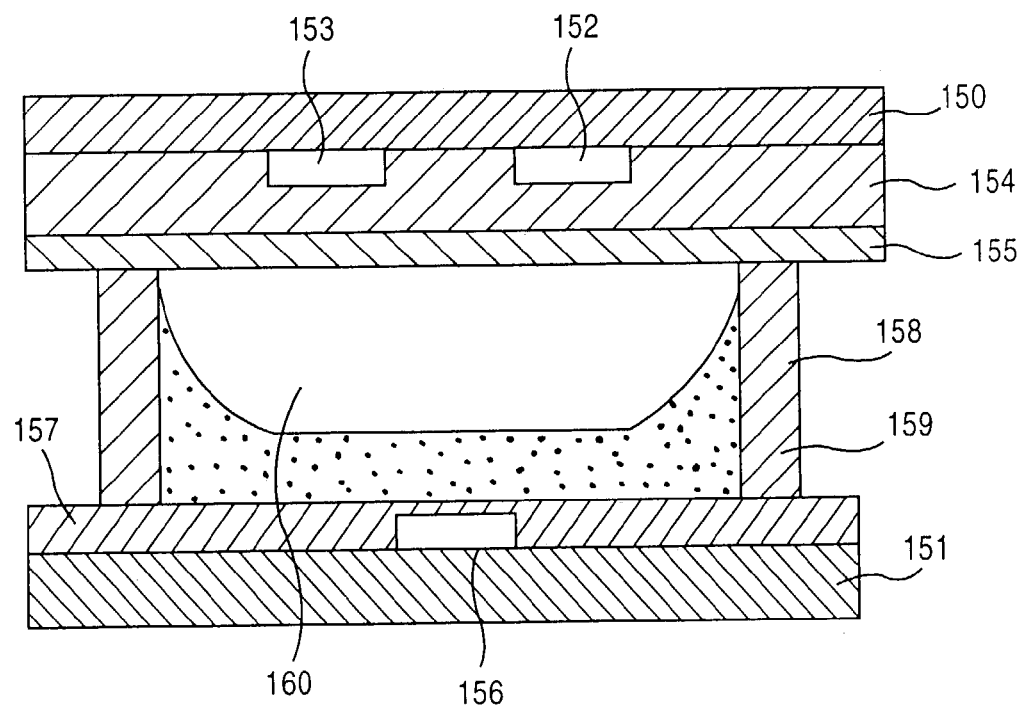
FIG. 30 shows an illustrating view of a plasma display panel.

In detail, the plasma welding torch 108 is provided with a cooling gas port 110. Welding of the plasma jet 109 is concurrent with flowing of the cooling gas 111 toward the base board 103. Nitrogen gas is used as the cooling gas 111. The cooling gas may reduce the damage of the photo sensitive coating layer 104 due to heat under the welding, and thereby, a partition wall may be made finer. In the step of the welding, the welding film 107 is generally deposited inside the grooves of the photosensitive coating layer 104, in a manner to swell on the surface of the photosensitive layer 104. However, the photosensitive layer 104 is less deposed on the periphery thereof. Then, as shown in FIG. 29(f), the welding film 107 over the surface of the photosensitive coating layer 104 is generally removed by means of grinding, so as to flatten the surface of the welding film 107 deposited inside the grooves of the photosensitive coating layer 104. Then, as shown in FIG. 29(g), the base board 103 is burned in an atmosphere including oxygen at a high temperature, and thereby, the photosensitive resin of organic components is burned out and changed into gases, such as, carbon dioxide, for removal. Thus, a partition wall 107 having a predetermined shape is formed on the base board 103. As described here, the partition wall for a plasma display is prepared. See FIG. 30.

The plasma display panel, as described here as an application example of the present invention, has a front base board 150 and a back base board 151 opposed to the front base board 150. The front base board 150 is provided with an indication electrode 152, 153, a dielectric layer 154, and an MgO dielectric protective layer 155 formed thereon in such orders. The back base board 151 is provided with an address electrode 156 and a dielectric layer 157 formed thereon, on which a partition wall 158 is formed. The side surface of the partition wall 158 is coated with a fluorescence layer 159. Between the front base board 150 and the back base board 151, an electric discharging gas 160 is filled at a specific pressure. The electric discharging gas 160 is discharged between the indication electrodes 152, 153 to generate an ultraviolet ray, which irradiates the fluorescence layer 159 to make a picture indication, for example, a color picture indication.

As described above, several application example of the present invention are explained, based on preparation methods for various devices which may be applicable to the present invention. The resist pattern-improving material according to the present invention may reduce the edge roughness in the step of patterning. It would be possible to continue to use photo irradiation techniques for a while, and to easily produce high density devices in mass production. This specification shows several applications, but the invention is not limited to the explanations here, and may be modified on the merit within the scope of the present invention.

For example, the above description says that the nonionic surfactant is selected from the group consisting of polyoxy ethylene-polyoxy propylene copolymer, polyoxy alkylene alkyl ethers, polyoxy ethylene alkyl ethers, polyoxy ethylene derivatives, sorbic fatty acid esters, glycerin fatty acid esters, primary alcohol ethoxylates, and phenol ethoxylates. Alternatively, another surfactant not listed here may be selected so long as it is a nonionic surfactant. Such an alternative will accomplish a similar effect specific to the present invention.

Also, the above description says that the alicyclic type resist materials may include resist materials for ArF excimer laser, such as acrylic type resist materials having an adamantyl group on the side chain. Alternatively, resist materials for ArF excimer laser, such as, acrylic type resist materials having a norbornene group on the side chain, and the like, or resist materials for ArF excimer laser, such as, COMA (cycloolefin maleic acid anhydride type) type resist materials, and the like, may be used. Also, a resist materials for ArF excimer laser, such as, alicyclic cycloolefins having an adamantyl group, norbornene group, and the like, on its main chain. Also, these resins listed here may be fluorinated at a part of the main chain or side chain thereof, and if so, it will be possible to work in a fine manner since it makes a resist pattern applicable to irradiation of $F_2$ excimer laser light.

The explanations above relate to methods for various semiconductor devices, but the present invention may be applicable to the followings, which need small and fine patterns: for example, functional parts, such as, mask pattern, rectil pattern, LCD (liquid crystalline display), SAW filter (elastic surface wave filter), and so on; optical parts used for connecting optical wiring; fine and small parts, such as, micro actuators, and so on. Also, as an example application of semiconductor devices, a process for preparing a flash memory is explained in detail, but the present invention is not limited thereto. The present invention may be also applicable to a method for preparing a logic device, DRAM, FRAM, and so on.

Also, the applications described above is focused on explanations of the resist pattern-improving material according to the present invention, especially with respect to manufacturing processes and their applications. However, the explanation described above, such as, the mixing ratio of the composition, must not limit the scope of the invention.

According to the present invention, it is possible to form a good pattern having a reduced edge roughness, resulting in maintaining a mass production for preparing highly fine devices, without avoiding short circuit and bad condition patterns.

According to the present invention, several effects are expected. For example, it is possible to form a pattern which is controlled to have less varied sizes. It is possible to use a laser exceeding an irradiation criticality of a deep ultraviolet irradiation, by using, for example, an ArF (argon fluoride) excimer laser (having a wavelength of 193 nm), and so on. Therefore, it may contribute to continue to use photo irradiation working, and also, mass production for devices may be contained to use.

The symbols used in this specification are summarized below.

1: photo resist film, 1a: resist pattern, 2: resist pattern-improving film, 2a: resist pattern having improved, 3: layer insulation film, 4: improved portion of the resist pattern, 22: Si base board (semiconductor base board), 23, field oxidation film, 24a: first gate insulating film, 24b: second gate insulating film, 25a: first threshold controlling layer, 25b: second threshold controlling layer, 26, 27, 29, 32, 34, 43: resist film, 28, 28a. first polysilicon film (first conductive film), 28b: gate electrode (first polysilicon film), 28c: floating gate electrode, 30a, 30c: capacitor insulating film, 30b, 30d. $SiO_2$ film, 31, 31b: second polysilicon film (second conductive film), 31a: control gate electrode, 33a, 44a: first gate portion, 33b, 33c, 44b: second gate portion, 35a, 35b, 36a, 36b, 45a, 45b, 46a, 46: source drain region layer, 37, 47: layer insulation film, 38a, 38b, 39a, 39b, 48a, 48b, 49a, 49b: contact hole, 40a, 40b, 41a, 41b, 50a, 50b, 51a, 51b: source drain electrode, 42: high melting temperature metal film (fourth conductive film), 42a: control gate electrode (high melting temperature metal film, fourth conductive film), 42b: gate electrode (high melting temperature metal film, fourth conductive film), 52a, 52b: opening portion, 53a, 53b: high melting temperature metal film (third conductive film), 54: insulating film, 11: MR element portion, 12: terminal, 211: supporting material, 221: alumina layer, 231: lower shield layer, 241: lower gap layer, 251: MR pattern, 261: first resist layer, 271 monochromatic light, 291: second resist layer, 301: i ray, 311: irradiation portion, 321: irradiation portion, 331: terminal forming material, 411: MR element, 421, terminal, 431: first resist layer, 441: second resist layer, 61: supporting material, 62, alumina layer, 63: lower shield layer, 63': lower shield, 64: lower gap layer, 64': lower gap, 65: MR film, 66: MR element, 67: mask pattern, 68: terminal, 81: metal film, 83: lower shield layer, 84: lower gap layer, 85: MR film, 85a: MR element, 86: first resist layer, 87: second resist layer, 88: i ray, 89: two layer resist pattern, 90: GaAs base board, 91: resist pattern, 92: insulating film, 92a: opening portion, 93: first metal wiring layer, 94: resist layer, 94a: opening portion, 95: second metal wiring layer, 100: glass base board, 101: address electrode, 102: surface preparation layer, 103: base board, 104: photosensitive resin layer, 105: photo mask, 107: welding film, 108: plasma welding torch, 109: plasma jet, 110: cooling gas port, 111: cooling gas, 150: front base board, 151: back base board, 152: indication electrode, 153: indication electrode, 154: dielectric layer, 155: MgO dielectric layer protective layer, 156: address electrode, 157: dielectric layer, 158: partition wall, 159: fluorescence layer, 160: electric discharging gas, 300: layer insulation layer, 302: resist pattern, 304: opening portion, 306: plating surface preparation layer, 308: thin film conductive layer(Cu plating film), 310: thin film magnetic coil, 312: non-magnetic base board, 314: gap layer, 316: resin insulating layer, 318: resist film, 318a: resist pattern, 320: first spiral pattern, 322: conductive surface preparation layer, 324: resist layer, 326: resist pattern, 328: Cu conductive film, 330: thin film magnetic coil, 332: writable magnetic pole of a magnetic layer

What is claimed is:
1. A method for preparing a pattern, comprising:
forming a resist pattern; and
coating a resist pattern-improving material on the surface of the resist pattern, wherein the resist pattern-improving material is mixed with the resist pattern at the interface therebetween, wherein the resist pattern-improving material comprises:

(a) a water-soluble or alkali-soluble composition, comprising:
  (i) a resin, and
  (ii) a crosslinking agent or nonionic surfactant, and
(b) a water-soluble aromatic compound,
  wherein the water-soluble aromatic compound is selected from the group consisting of polyhydric phenols represented by gallic acid, and derivatives thereof; naphthalene polyhydric alcohols represented by naphthalenediol, naphthalenetriol, and derivatives thereof; and benzophenone derivative represented by alizarin yellow A,
wherein the resist pattern is formed by irradiating an ArF excimar laser light or a laser light having a wavelength shorter than that of the ArF excimar laser light, and wherein the pattern of the resist pattern-improving material includes a base resin which does not substantially transmit the ArF excimar laser light.

2. A method for preparing a pattern according to claim 1, wherein the amount of the closslinking is controlled by the coated film thickness, the temperature for baking, and/or the period for baking, to reduce the amount of the edge roughness of the resist pattern into a predetermined level.

3. A method for preparing a pattern according to claim 2, wherein the variation of the size of the resist pattern is controlled within the range of 10% and less, and wherein the amount of the edge roughness is controlled to reduce within the range of 5% and less, of the size of the pattern.

4. A method for preparing a pattern according to claim 3, wherein a resist material is selected from the group consisting of novolac type, PHS type, acrylic type, COMA type, alicyclicacrylic hybrid type, and the fluorinated derivatives thereof.

5. A method for preparing a pattern, comprising:
forming a resist pattern; and
coating a resist pattern-improving material on the surface of the resist pattern,
wherein the resist pattern-improving material, comprising:
(a) a water-soluble or alkali-soluble composition, comprising:
  (i) a resin, and
  (ii) a crosslinking agent or nonionic surfactant, and
(b) a water-soluble aromatic compound,
wherein the resist pattern-improving material is mixed with the resist pattern at the interface therebetween, wherein the amount of the mixing is controlled by the coated film thickness, the temperature for baking, and/or the period for baking, to reduce the amount of the edge roughness of the resist pattern into a predetermined level.

6. A method for preparing a semiconductor device, comprising:
(a) forming a resist pattern;
(b) coating the resist pattern with a resist pattern-improving material to cover the surface of the resist pattern, thereby reducing an edge roughness of the resist pattern; and
(c) patterning a surface preparation layer by means of dry etching while using the resist pattern having a reduced edge roughness as a mask, the resist pattern-improving material comprises:
(a) a water-soluble or alkali-soluble composition, comprising:
  (i) a resin, and
  (ii) a crosslinking agent or nonionic surfactant,
(b) a water-soluble aromatic compound, and
  wherein the water-soluble aromatic compound is selected from the group consisting of polyhydric phenols represented by gallic acid, and derivatives thereof; naphthalene polyhydric alcohols represented by naphthalenediol, naphthalenetriol, and derivatives thereof; and benzophenone derivative represented by alizarin yellow A,
wherein the resist pattern is formed by irradiating an ArF excimar laser light or a laser light having a wavelength shorter than that of the ArF excimar laser light, and wherein the pattern of the resist pattern-improving material includes a base resin which does not substantially transmit the ArF excimar laser light.

7. A method for preparing a pattern, comprising:
(a) forming a resist pattern on a substrate;
(b) coating, on the resist pattern, a solution including at least one surfactant selected from the group consisting of polyoxy ethylene-polyoxy propylene copolymer, polyoxy alkylene alkyl ethers, polyoxy ethlene alkyl ethers, polyoxy ethylene derivatives, sorbic fatty acid esters, glycerin fatty acid esters, primary alcohol ethoxylates, and phenol ethoxylates;
(c) coating a water-soluble or alkali-soluble composition, comprising:
  (i) at least one resin selected from the group consisting of polyvinyl alcohol, polyvinyl acetal and polyvinyl acetate,
  (ii) at least one crosslinking agent selected from the group consisting of melamine derivatives, urea derivatives, and uril derivatives, and
  (iii) a water-soluble aromatic compound, and
(d) baking the substrate to cause a crosslinking reaction,
wherein the resist pattern is formed by irradiating an ArF excimar laser light or a laser light having a wavelength shorter than that of the ArF excimar laser light, and wherein the pattern of the resist pattern-improving material includes a base resin which does not substantially transmit the ArF excimar laser light.

8. A method for preparing a pattern according to claim 7, wherein in addition to the base resin, the resist pattern-improving material further includes at least one selected from the group consisting of crosslinking agents, water-soluble aromatic compounds, solvents, surfactants, thereby controlling the variation of the size of the resist pattern within the range of 10% and less.

9. A method for preparing a pattern, comprising:
forming a resist pattern; and
coating a resist pattern-improving material on the surface of the resist pattern,
wherein the resist pattern-improving material, comprising:
(a) a water-soluble or alkali-soluble composition, comprising:
  (i) at least one resin selected from the group consisting of polyvinyl alcohol, polyvinyl acetal and polyvinyl acetate, and
  (ii) at least one crosslinking agent selected from the group consisting of melamine derivatives, urea derivatives, and uril derivatives, and
(b) a water-soluble aromatic compound,
wherein the resist pattern-improving material is mixed with the resist pattern at the interface therebetween, wherein the amount of the mixing is controlled by the coated film thickness, the temperature for baking, and/or the period for baking, to reduce the amount of the edge roughness of the resist pattern into a predetermined level.

10. A method for preparing a pattern, comprising:
forming a resist pattern; and
coating a resist pattern-improving material on the surface of the resist pattern,
wherein the resist pattern-improving material, comprising:
(a) a water-soluble or alkali-soluble composition, comprising:
  (i) at least one resin selected from the group consisting of polyvinyl alcohol, polyvinyl acetal and polyvinyl acetate, and
  (ii) at least one crosslinking agent selected from the group consisting of melamine derivatives, urea derivatives, and uril derivatives, and
(b) a water-soluble aromatic compound selected from the group consisting of polyhydric phenols represented by resorcin, resorcin [4] arene, pyrogallol, gallic acid, and derivatives thereof; aromatic carboxylic acids represented by salicylic acid, phthalic acid, dihydroxybenzoic acid, and derivatives thereof; naphthalene polyhydric alcohols represented by naphthalenediol, naphthalenetriol, and derivatives thereof; and benzophenone derivatives represented by alizarin yellow A,
wherein the resist pattern-improving material is mixed with the resist pattern at the interface therebetween, wherein the amount of the mixing is controlled by the coated film thickness, the temperature for baking, and/or the period for baking, to reduce the amount of the edge roughness of the resist pattern into a predetermined level.

11. A method for preparing a pattern, comprising:
forming a resist pattern; and
coating a resist pattern-improving material on the surface of the resist pattern, wherein the resist pattern-improving material is mixed with the resist pattern at the interface therebetween, wherein the resist pattern-improving material comprises:
(a) a water-soluble or alkali-soluble composition, comprising:
  (i) at least one resin selected from the group consisting of polyvinyl alcohol, polyvinyl acetal and polyvinyl acetate, and
  (ii) at least one crosslinking agent selected from the group consisting of melamine derivatives, and uril derivatives, and
(b) a water-soluble aromatic compound,
wherein the resist pattern is formed by irradiating an ArF excimar laser light or a laser light having a wavelength shorter than that of the ArF excimar laser light, and wherein the pattern of the resist pattern-improving material includes a base resin which does not substantially transmit the ArF excimar laser light.

12. A method for preparing a pattern according to claim 11, wherein the variation of the size of the resist pattern is controlled within the range of 10% and less, and wherein the amount of the edge roughness is controlled to reduce within the range of 5% and less, of the size of the pattern.

13. A method for preparing a pattern according to claim 12, wherein a resist material is selected from the group consisting of novolac type, PHS type, acrylic type, COMA type, alicyclicacrylic hybrid type, and the fluorinated derivatives thereof.

14. A method for preparing a pattern, comprising:
forming a resist pattern; and
coating a resist pattern-improving material on the surface of the resist pattern, wherein the resist pattern-improving material is mixed with the resist pattern at the interface therebetween, wherein the resist pattern-improving material comprises:
(a) a water-soluble or alkali-soluble composition, comprising:
  (i) at least one resin selected from the group consisting of polyvinyl alcohol, polyvinyl acetal and polyvinyl acetate, and
  (ii) at least one crosslinking agent selected from the group consisting of melamine derivatives, urea derivatives, and uril derivatives,
(b) a water-soluble aromatic compound selected from the group consisting of polyhydric phenols represented by resorcin, resorcin [4] arene, pyrogallol, gallic acid, and derivatives thereof; naphthalene polyhydric alcohols represented by naphthalenediol, naphthalenetriol, and derivatives thereof; and benzophenone derivatives represented by alizarin yellow A wherein the resist pattern-improving material crosslinks by baking,
wherein the resist pattern is formed by irradiating an ArF excimar laser light or a laser light having a wavelength shorter than that of the ArF excimar laser light, and wherein the pattern of the resist pattern-improving material includes a base resin which does not substantially transmit the ArF excimar laser light.

15. A method for preparing a pattern according to claim 14, wherein the variation of the size of the resist pattern is controlled within the range of 10% and less, and wherein the amount of the edge roughness is controlled to reduce within the range of 5% and less, of the size of the pattern.

16. A method for preparing a pattern according to claim 15, wherein a resist material is selected from the group consisting of novolac type, PHS type, acrylic type, COMA type, alicyclicacrylic hybrid type, and the fluorinated derivatives thereof.

17. A method for preparing a semiconductor device, comprising:
(a) forming a resist pattern;
(b) coating the resist pattern with a resist pattern-improving material to cover the surface of the resist pattern, thereby reducing an edge roughness of the resist pattern; and
(c) patterning a surface preparation layer by means of dry etching while using the resist pattern having a reduced edge roughness as a mask, the resist pattern-improving material comprises:
(a) a water-soluble or alkali-soluble composition, comprising:
  (i) at least one resin selected from the group consisting of polyvinyl alcohol, polyvinyl acetal and polyvinyl acetate, and
  (ii) at least one crosslinking agent selected from the group consisting of melamine derivatives, and uril derivatives, and
(b) a water-soluble aromatic compound,
wherein the resist pattern is formed by irradiating an ArF excimar laser light or a laser light having a wavelength shorter than that of the ArF excimar laser light, and wherein the pattern of the resist pattern-improving material includes a base resin which does not substantially transmit the ArF excimar laser light.

18. A method for preparing a semiconductor device, comprising:
- (a) forming a resist pattern;
- (b) coating the resist pattern with a resist pattern-improving material to cover the surface of the resist pattern, thereby reducing an edge roughness of the resist pattern; and
- (c) patterning a surface preparation layer by means of dry etching while using the resist pattern having a reduced edge roughness as a mask, the resist pattern-improving material comprises:
- (a) a water-soluble or alkali-soluble composition, comprising:
    - (i) at least one resin selected from the group consisting of polyvinyl alcohol, polyvinyl acetal and polyvinyl acetate, and
    - (ii) at least one crosslinking agent selected from the group consisting of melamine derivatives, urea derivatives, and uril derivatives,
- (b) a water-soluble aromatic compound selected from the group consisting of polyhydric phenols represented by resorcin, resorcin [4] arene, pyrogallol, gallic acid, and derivatives thereof; naphthalene polyhydric alcohols represented by naphthalenediol, naphthalenetriol, and derivatives thereof; and benzophenone derivatives represented by alizarin yellow A, wherein the resist pattern-improving material crosslinks by baking wherein the resist pattern is formed by irradiating an ArF excimar laser light or a laser light having a wavelength shorter than that of the ArF excimar laser light, and wherein the pattern of the resist pattern-improving material includes a base resin which does not substantially transmit the ArF excimar laser light.

* * * * *